(12) United States Patent
Bobde et al.

(10) Patent No.: US 8,575,695 B2
(45) Date of Patent: Nov. 5, 2013

(54) LATERAL SUPER JUNCTION DEVICE WITH HIGH SUBSTRATE-DRAIN BREAKDOWN AND BUILT-IN AVALANCHE CLAMP DIODE

(75) Inventors: Madhur Bobde, San Jose, CA (US); Anup Bhalla, Santa Clara, CA (US); Hamza Yilmaz, Saratoga, CA (US); Wilson Ma, Sunnyvale, CA (US); Lingpeng Guan, Sunnyvale, CA (US); Yeeheng Lee, San Jose, CA (US); John Chen, Palo Alto, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 754 days.

(21) Appl. No.: 12/592,619

(22) Filed: Nov. 30, 2009

(65) Prior Publication Data
US 2011/0127606 A1    Jun. 2, 2011

(51) Int. Cl.
*H01L 29/66* (2006.01)
*H01L 21/00* (2006.01)

(52) U.S. Cl.
USPC ........... 257/341; 257/107; 257/175; 257/199; 257/481; 438/237; 438/328

(58) Field of Classification Search
USPC ........... 257/106, 175, 199, 481; 438/237, 328
See application file for complete search history.

(56) References Cited

U.S. PATENT DOCUMENTS

| | | | |
|---|---|---|---|
| 4,754,310 A * | 6/1988 | Coe | 257/287 |
| 5,777,369 A * | 7/1998 | Lin et al. | 257/368 |
| 6,835,993 B2 * | 12/2004 | Sridevan et al. | 257/492 |
| 2003/0057479 A1 * | 3/2003 | Ahlers et al. | 257/328 |
| 2005/0218431 A1 * | 10/2005 | Nair et al. | 257/262 |
| 2008/0001198 A1 * | 1/2008 | Jeon et al. | 257/298 |

* cited by examiner

*Primary Examiner* — Jarrett Stark
*Assistant Examiner* — Nicholas Tobergte
(74) *Attorney, Agent, or Firm* — Bo-In Lin

(57) ABSTRACT

This invention discloses configurations and methods to manufacture lateral power device including a super-junction structure with an avalanche clamp diode formed between the drain and the gate. The lateral super-junction structure reduces on-resistance, while the structural enhancements, including an avalanche clamping diode and an N buffer region, increase the breakdown voltage between substrate and drain and improve unclamped inductive switching (UIS) performance.

18 Claims, 44 Drawing Sheets

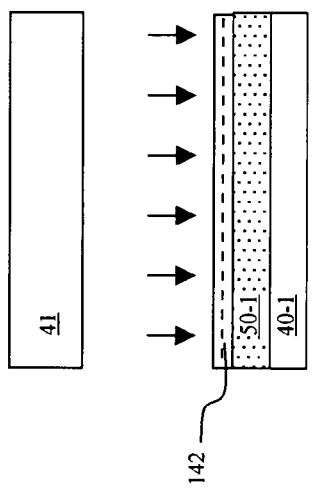
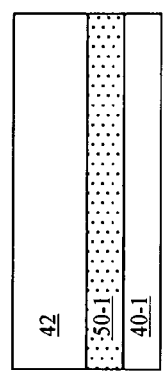
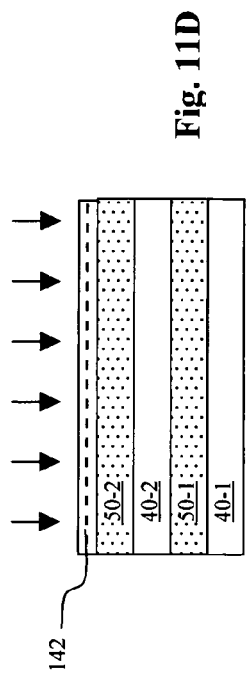
Fig. 11A  Fig. 11B  Fig. 11C  Fig. 11D
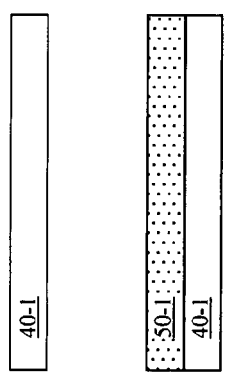
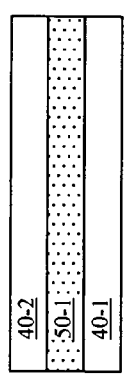
Fig. 10A  Fig. 10B  Fig. 10C  Fig. 10D

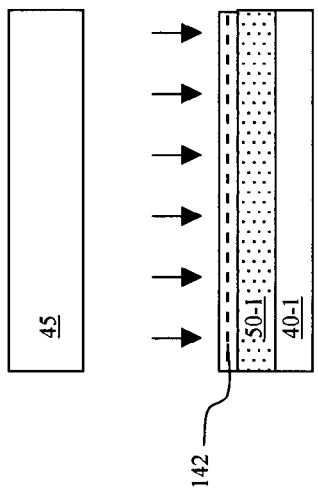
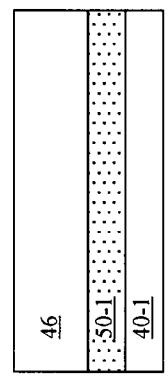
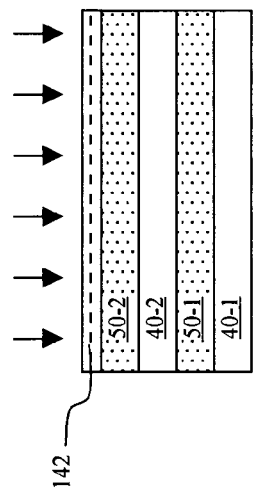
Fig. 12A  Fig. 12B  Fig. 12C  Fig. 12D

US 8,575,695 B2

LATERAL SUPER JUNCTION DEVICE WITH HIGH SUBSTRATE-DRAIN BREAKDOWN AND BUILT-IN AVALANCHE CLAMP DIODE

BACKGROUND OF THE INVENTION

1. Field of the Invention

The invention relates generally to semiconductor power devices. More particularly, this invention relates to configurations and methods to manufacture lateral power device including a super-junction structure with an avalanche clamp diode formed between the drain and the gate. The lateral super-junction structure reduces on-resistance, while the structural enhancements increase the breakdown voltage between substrate and drain and improve unclamped inductive switching (UIS) performance.

2. Description of the Prior Art

Conventional semiconductor power device such as the MOSFET power devices implemented with a super-junction structure can achieve performance improvements with significant reduction of the on-resistance while still maintaining a high breakdown voltage. However, the manufacturing technologies and device configuration for implementing the super-junction structures in the MOSFET devices are still confronted with manufacturability difficulties. The manufacturing ease and cost of the conventional vertical high voltage power devices implemented with super-junction structures are limited due to the structural features that require numerous time-consuming, complex, and expensive manufacturing processes. The current practice involves many sequential masking, implantation and epitaxial growth steps to build the vertical structure. Achieving a high density of alternately doped columns becomes prohibitive since it requires a direct increase in the number of these steps. Too many factors influence the accuracy of charge-balance between adjacent alternately doped columns, leading to narrow process margins as a high density of said columns is attempted. FIG. 1A shows a typical design for a MOSFET vertical super junction device, as disclosed by Tatsuhiko Fujihira in his paper "Theory of Semiconductor Superjunction Devices" published in Jpn. J. Appl. Phys. 36 (1997) pp. 6254-6262. It is difficult and costly to manufacture the vertical charge-balanced alternately doped columns of FIG. 1A, especially at high densities.

For these reasons, lateral JFET power devices with super junction structures formed with stacked horizontal layers of alternating dopant conductivity types overcome these difficulties. This device may be configured in cascade with a low voltage MOSFET to achieve the normally-off operation of a conventional device. Coe discloses a lateral power device in U.S. Pat. No. 4,754,310 with charge balanced super junction structure configured with stacked horizontal layers of alternating conductivity types extended between a source and drain column. Such structure of stacked horizontal layers can be efficiently manufactured without the use of masks. However, a typical device configuration as shown in FIG. 1B is limited by its drain-substrate breakdown voltage and is further restricted due to the difficulty in improving its unclamped inductive switching (UIS). FIG. 1C shows an example of another lateral super junction device as disclosed by Tatsuhiko Fujihira in the same paper as mentioned above, "Theory of Semiconductor Superjunction Devices". This device suffers from excessive channel resistance in distributing the current into the stacked n-type conduction paths.

Therefore, a need still exists in the art of power semiconductor device design and manufacture to provide new device configurations and manufacturing methods for forming the lateral power device such that the above discussed problems and limitations can be resolved.

SUMMARY OF THE INVENTION

It is therefore an aspect of the present invention to provide a new and improved device structure and manufacturing method to form the junction field effect transistor (JFET) power device on a P substrate with lateral super junction structure extended between deep N type columns functioning as the source and drain columns. The normally-on JFET device is implemented with configuration and device characteristics to achieve a high breakdown voltage whereby the above discussed difficulties and limitations may be resolved.

It is another aspect of this invention to provide a new and improved device structure and manufacturing method to form the junction field effect transistor (JFET) power device such that a vertical PN diode is incorporated between drain and substrate below allowing unclamped inductive switching performance to be improved. The substrate may be at gate potential, having a gate metal on its bottom side.

It is another aspect of this invention to provide a new and improved device structure and manufacturing method to form the junction field effect transistor (JFET) power device such that the structure and configuration of the JFET device with deep column type drain columns provides a built-in clamp diode to divert all avalanche current from the super junction sections of the device.

It is another aspect of this invention to provide a new and improved device structure and manufacturing method to form the junction field effect transistor (JFET) power device such that the structure and configuration of the JFET device includes a buried N− buffer layer below the deep drain column. The peak electric field under the drain can be significantly reduced minimizing the E-field increase due to the cylindrical junction between the drain trench and the substrate. With the reduction of electrical field crowding, the breakdown voltage can be further increased.

Briefly in a preferred embodiment this invention discloses a semiconductor power device. The semiconductor power device comprises a semiconductor substrate with a super-junction structure including a plurality of alternating P-doped and N-doped layers extending laterally from a trench source column to a trench drain column wherein the trench source column and drain column extend downwards into the semiconductor substrate through two opposite sides of the super junction structure disposed in the semiconductor substrate. The power device further includes a gate for applying a voltage thereon to control a current transmitted laterally through the super junction structure between the source and the drain columns. The gate may comprise a P+ column extending down through the super junction structure to contact the substrate. The semiconductor substrate is a P− substrate with a surface and the trench source column and drain column are N+ columns that form a diode at a junction of the trench drain column with the P− substrate to function as a built-in avalanche clamp diode. In an embodiment, the P− substrate further comprises a P+ bottom substrate supporting a P− epitaxial layer atop. In an embodiment, the semiconductor power device further includes a buried doped region disposed in the semiconductor substrate below the drain trench for suppressing electrical field crowding and to improve breakdown voltage between the drain trench and substrate. In another embodiment, the buried doped region is n N-buffer layer extending laterally between and disposed vertically below the trench source column and drain column. In another embodiment, the buried doped region is an N-buffer region disposed in the semiconductor substrate below and surrounding bottom sidewalls and a bottom wall of the trench drain column. In another embodiment, the semiconductor power device further includes a source and drain graded N diffusion region surrounding sidewalls of the trench source and drain columns respectively. In another embodiment, the gate further comprises a trench P+ column disposed in a gate trench connected to the P doped layers of the super junction structure for applying a voltage to control a current transmitted through the super junction structure. In another embodiment, the semiconductor power device further includes a graded P diffusion region having a graded P dopant profile diffused from the P+ column of the trench gate column. In another embodiment, the gate further comprises a trench P+ column disposed in a gate trench connected to the P doped layers of the super junction structure and disposed between the trench source column and the trench drain column or adjacent to the trench source column for applying a voltage to control a current transmitted through the super junction structure.

This invention further discloses a method for forming a semiconductor power device on a semiconductor substrate. The method includes a step of growing a P− epitaxial layer on top of a P+ substrate followed by implanting an N-buffer layer as a buried N buffer layer at a buried layer depth below a top surface of the P− epitaxial layer; alternately growing undoped (or lightly doped) epitaxial layers and implanting P type and N type dopants to form alternating P doped layer and N doped layer to function as a lateral super junction structure above the buried N buffer layer; opening a gate trench in the semiconductor substrate with a trench depth at least reaching the P− epitaxial layer followed by filling the gate trench with a gate material; and opening source and drain trenches in the semiconductor substrate on two opposite sides of the lateral super junction structure having a trench depth reaching the buried N buffer layer followed by filling each of the source and drain trenches with a conductive material. In an alternate embodiment, the step of opening the gate trench in the semiconductor substrate further comprises a step of implanting a P doped region in the semiconductor substrate surrounding the sidewalls of the gate trench and below a trench bottom surface of the gate trench. In another embodiment, the step of opening the source and drain trenches in the semiconductor substrate further comprising a step of implanting N doped regions in the semiconductor substrate surrounding sidewalls of the source and drain trenches and below a trench bottom surface of the source and drain trenches. In another embodiment, the step of filling the gate trench with a gate material further comprising a step of forming a polysilicon layer as a padded layer on sidewalls and a bottom surface of the gate trench followed by filling an oxide layer into the gate trench and etching back the polysilicon and oxide layer from a top surface of the semiconductor substrate. In another embodiment, the polysilicon layer in the gate trench may be in-situ doped p-type, and an optional diffusion from the polysilicon into the substrate may be used. In another embodiment, the step of filling the source and drain trenches with conductive columns further comprises a step of filling thick metal columns into the source and drain trenches followed by etching back the thick metal layer from a top surface of an oxide layer covering over a top surface of the semiconductor substrate. In another embodiment, the source and drain trenches may be lined with a conductive metal, and the remaining space within the column filled with a dielectric, polysilicon or another metal. In another embodiment, the step of filling the source and drain comprises a step of filling a column of in-situ doped N+ Polysilicon. In another embodiment, the step of filling with N+ in-situ doped polysilicon may be followed by subsequent dopant diffusion from aforesaid polysilicon into the substrate. In another embodiment, selective epitaxial growth may be used to grow P-type regions in the gate trench and N− type regions in the source and drain trenches. In another embodiment, the step of opening the gate trench in the semiconductor substrate further comprising a step of opening the gate trench in a termination area opposite between the active device area and the drain trench near a die slicing boundary of the semiconductor power device.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIG. 2-1 is a cross sectional view of an alternative embodiment of a lateral super junction power device of this invention.

FIGS. 10A to 10D are cross sectional views for showing the processing steps to form the super junction structure of this invention.

FIGS. 11A to 11D are cross sectional views for showing alternate processing steps to form the super junction structure of this invention.

FIGS. 12A to 12D are cross sectional views for showing alternate processing steps to form the super junction structure of this invention.

FIGS. 15, and 15-1 to 15-3 are top views showing possible layout of the device having interdigitated source/gate fingers and drain fingers.

DETAILED DESCRIPTION OF THE METHOD

Figure 1A:
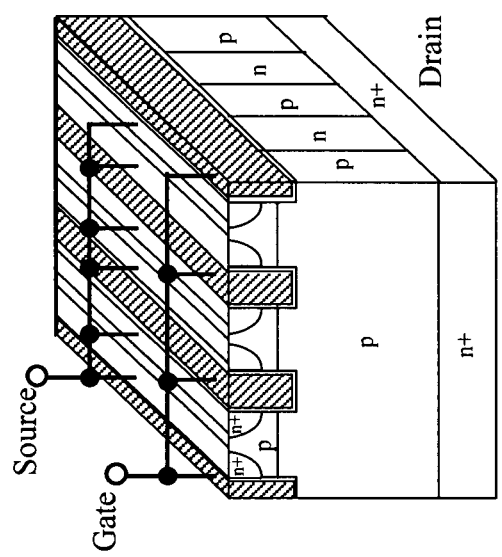
FIG. 1A is a cross sectional view for showing a conventional configuration of a vertical power device.
Figure 1B:
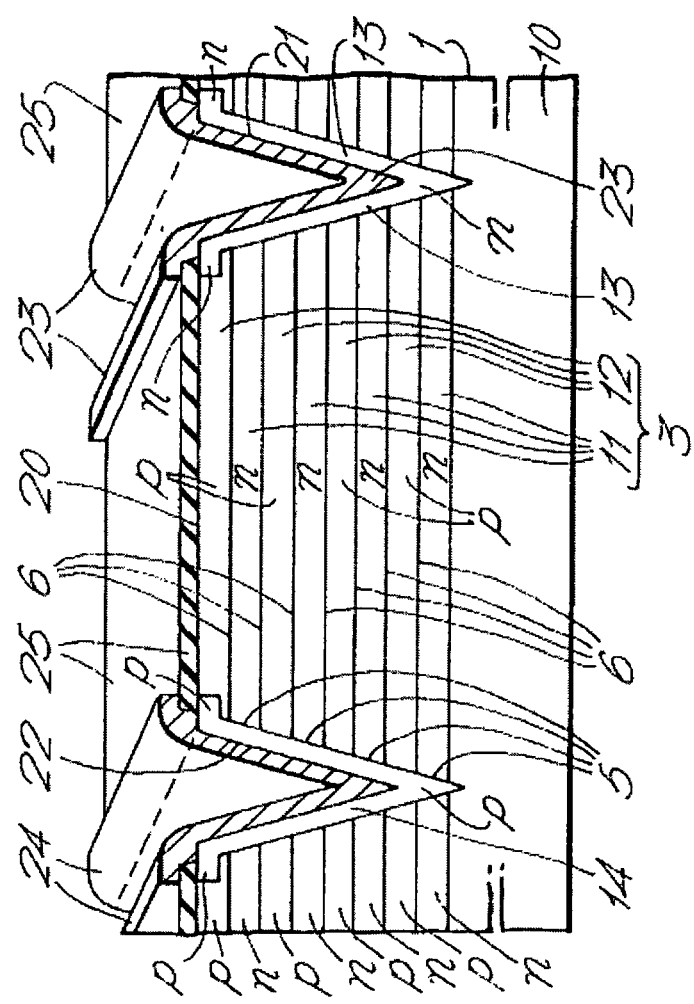
FIGS. 1B and 1C are cross sectional views for showing conventional lateral power devices.
Figure 1C:
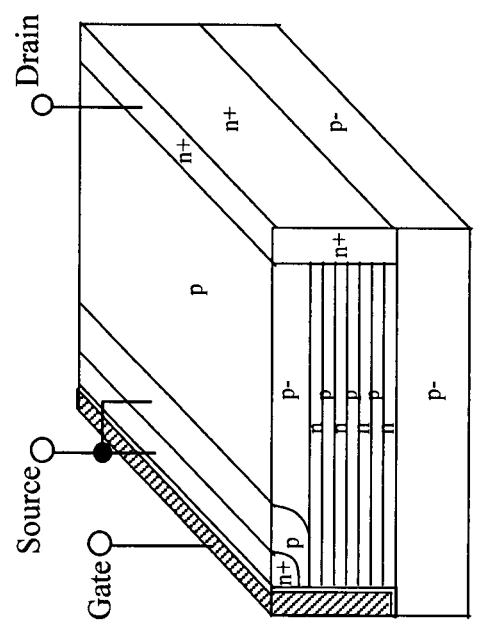
Figure 2:
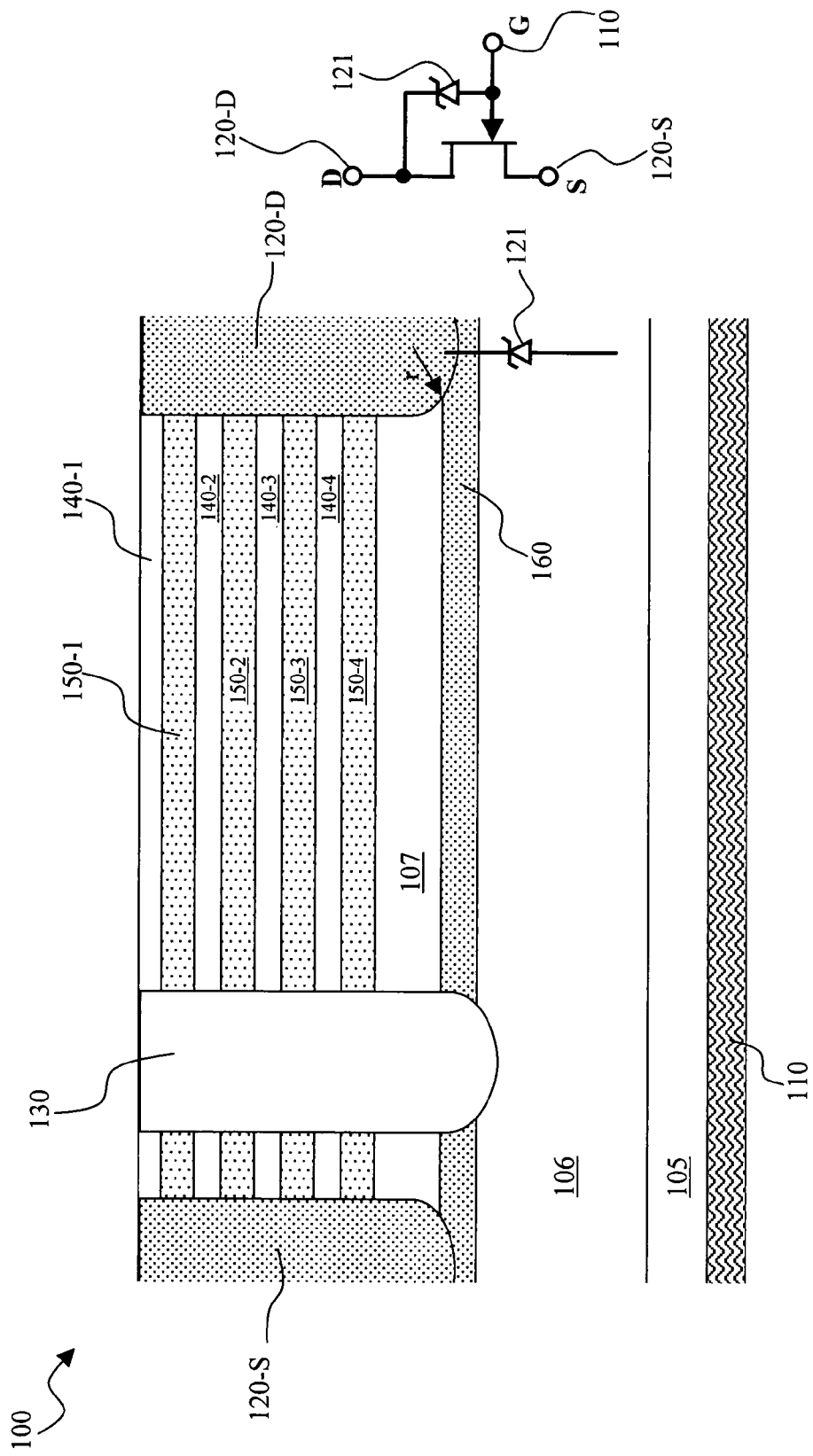
FIG. 2 is a cross sectional view of a lateral super junction power device of this invention.

Referring to FIG. 2 for a cross sectional view of a lateral power device 100 that illustrates the new concepts including the new structural and manufacturing features of this invention. The lateral power device 100 is supported on a P+ substrate 105 that includes a gate metal electrode 110 disposed on the bottom of the substrate. The P+ substrate 105 may further comprise a P Epi layer 106 on top of it. The lateral power device 100 includes a source and a drain formed as N+ column 120-S and N+ column 120-D, respectively, disposed in a first and second trench at two opposite sides of the semiconductor substrate. A P+ doped column 130 disposed in another trench functions as a gate of the lateral power device. The P+ doped column 130 connects to the P-Epi 106, thus the P+ substrate 105 is biased to the gate, and a gate metal 110 may be located at the bottom of P+ substrate 105 to control the gate column 130. The source and drain 120-S and 120-D may be formed with N+ doped polysilicon filling the trenches or may be formed with an N+ region lining the trenches and metal plug filling the trenches, or any other number of ways of forming a conductive N+ column.

The lateral power device has a super-junction structure formed as multiple stacked layers of alternated P doped epitaxial layers 140-1, 140-2, 140-3, . . . , 140-N and N doped epitaxial layers 150-1, 150-2, 150-3, . . . , 150-N. These alternated P doped and N doped epitaxial layers provide charge balanced conduction channels between the N+ source column 120-S and N+ drain column 120-D. The top and bottom p doped layers of the super junction stack are provided with half the charge of the intermediate p and n regions to maintain the correct charge balance. The electrical current is conducted along a lateral direction between the source 120-S and drain 120-D with a gate 130 to control and to switch on and off the power device 100. The source and gate columns 120-S, 130 are located to allow conduction between the source 120-S and drain 120-D, as can be seen in the top layouts of FIG. 5.

The lateral power device 100 further includes an N buffer layer 160 below the super-junction structure underneath the N+ doped drain column 120-D. The N-buffer layer 160 is provided to reduce the electrical field under the drain to offset the electrical field crowding due to the cylindrical junction formed under the drain 130 from the N+ column disposed in a trench. It is well known the art that the electric field increases around a sharp angle or turn leading to lower breakdown voltage. Without the N-buffer layer 160, the bottom of the N+ drain column 120-D would have formed a PN junction with the epitaxial layer 106 having a relatively sharp curvature with the radius 'r'. However, with the formation of the N-buffer layer 160, the curvature of the PN junction from the drain column 120-D to the gate is greatly reduced (essentially to no curvature), i.e., the equivalent radius is increased. This greatly improves the breakdown voltage of the device. It also decouples the breakdown voltage of the device from the radius at the bottom of the drain column 120-D trench. This allows the drain column 120-D to be made as thin as desired without concern of negative effects on breakdown voltage. The buried N-buffer layer is provided with dopant concentrations to maximize the breakdown voltage and to divert avalanche current away from the super junction section of the device. The P+ gate column connects to the P– Epi layer 106 through the N buffer layer 160. To achieve this, the P+ gate column may be formed deeper than the N buffer layer 160. The N buffer layer 160 may be designed to completely deplete during forward blocking to prevent shorting between the source and drain. Optionally, a portion of the P– Epi layer 107 may be found above the N buffer layer 160.

The N buffer layer 160 may be a flat blanket layer running all the way across, as shown in FIG. 2. Alternatively, as shown in the lateral power device 100-1 of FIG. 2-1, the N buffer layer 160-1 may be flat but formed only in certain portions of the device. Even the shortened N buffer layer 160-1 is effective in reducing the curvature of the bottom of the N+ drain column 120-D, thus reducing electric field crowding and improving device breakdown. A mask may be used to form the N buffer layer 160-1. For example the N buffer layer 160-1 may be implanted as a masked buried implant while forming the P– Epitaxial layer 106.

A super junction device is normally very vulnerable to damage from avalanche breakdown. If avalanche breakdown occurs in the charge balanced regions, the avalanche current tends to focus and magnify on the small area in which it started, permanently damaging that area. For that reason, a built-in avalanche clamp diode 121 is formed between the drain and gate from the P-Epi 106 to the N+ drain column 120-D. This is done by ensuring the PN junction from the N+ drain column 120-D to the P-Epi 106 below has a lower breakdown voltage than the breakdown voltage of the super junction area (formed by the charge balanced N and P layers 140-1, 150-1, . . . ), thus forming the avalanche Zener diode 121 there. This avalanche diode 121 is much more robust and has a much higher unclamped inductive switching rating (UIS) than the super-junction area. By ensuring it breaks down before the super-junction does, the UIS rating of the lateral power device 100 becomes decoupled from the UIS rating of the super junction region, and reflective of the UIS rating of the built-in avalanche diode 121 instead. So the breakdown between the drain column 120-D and the P substrate 105 should be designed to have as a high value as possible while still being lower than the breakdown voltage of the super-junction area, in order to clamp the avalanche breakdown.

Figures 1, 2:
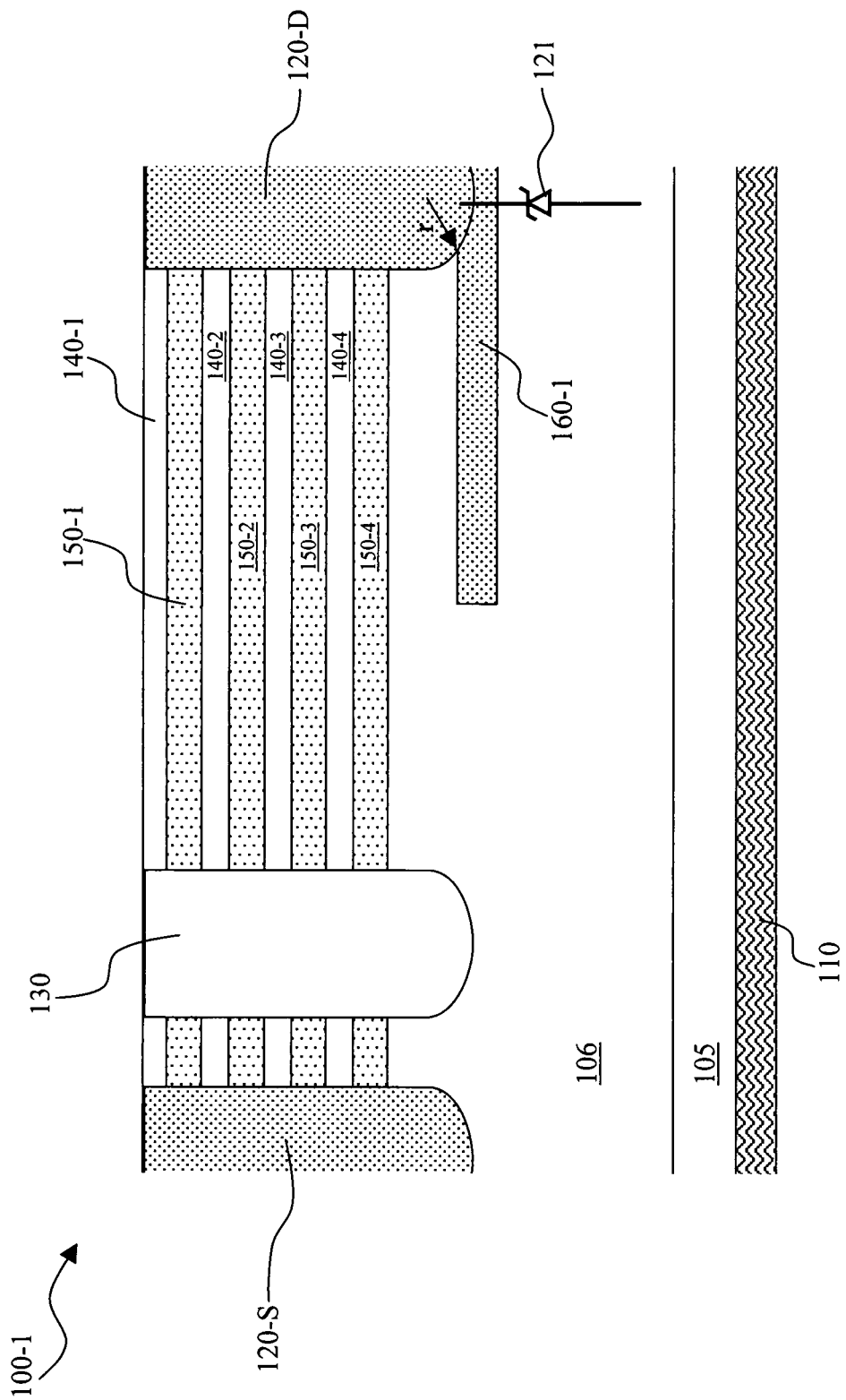
Figure 2A:
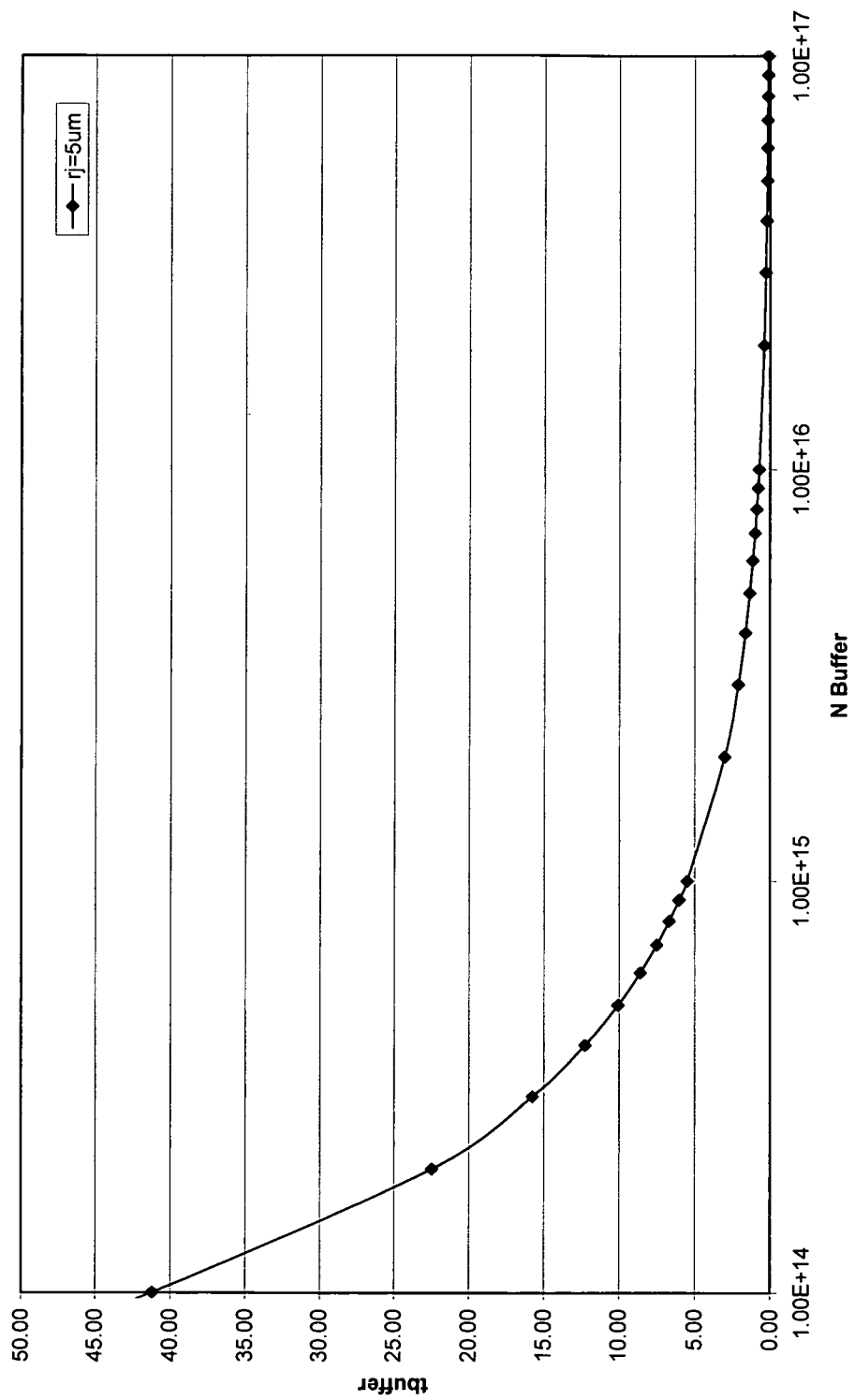
FIGS. 2A to 2C are diagrams for showing the device characteristic parameters for illustrating the performance improvements of the super junction lateral power device of FIG. 2.
Figure 2B:
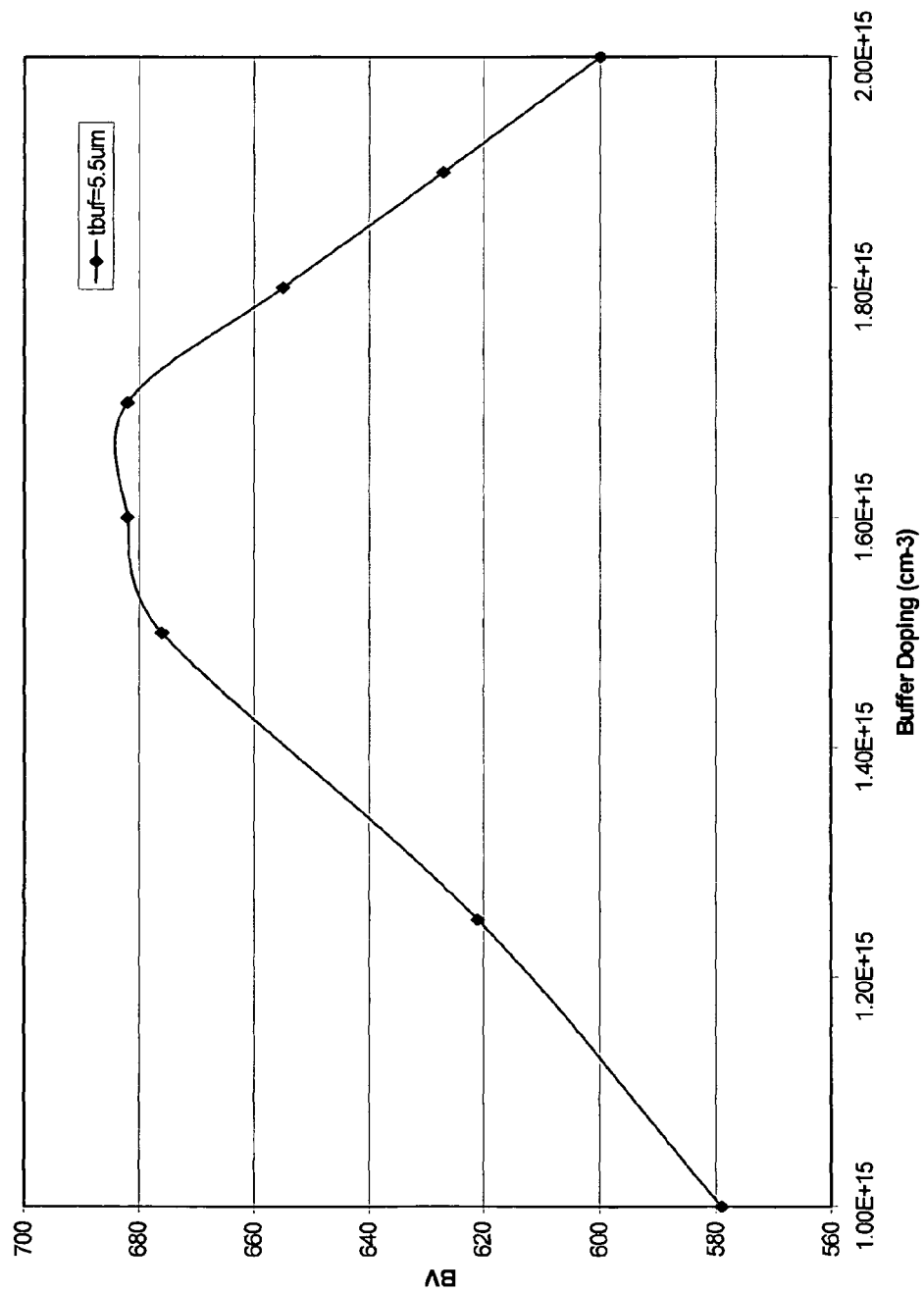
Figure 2C:
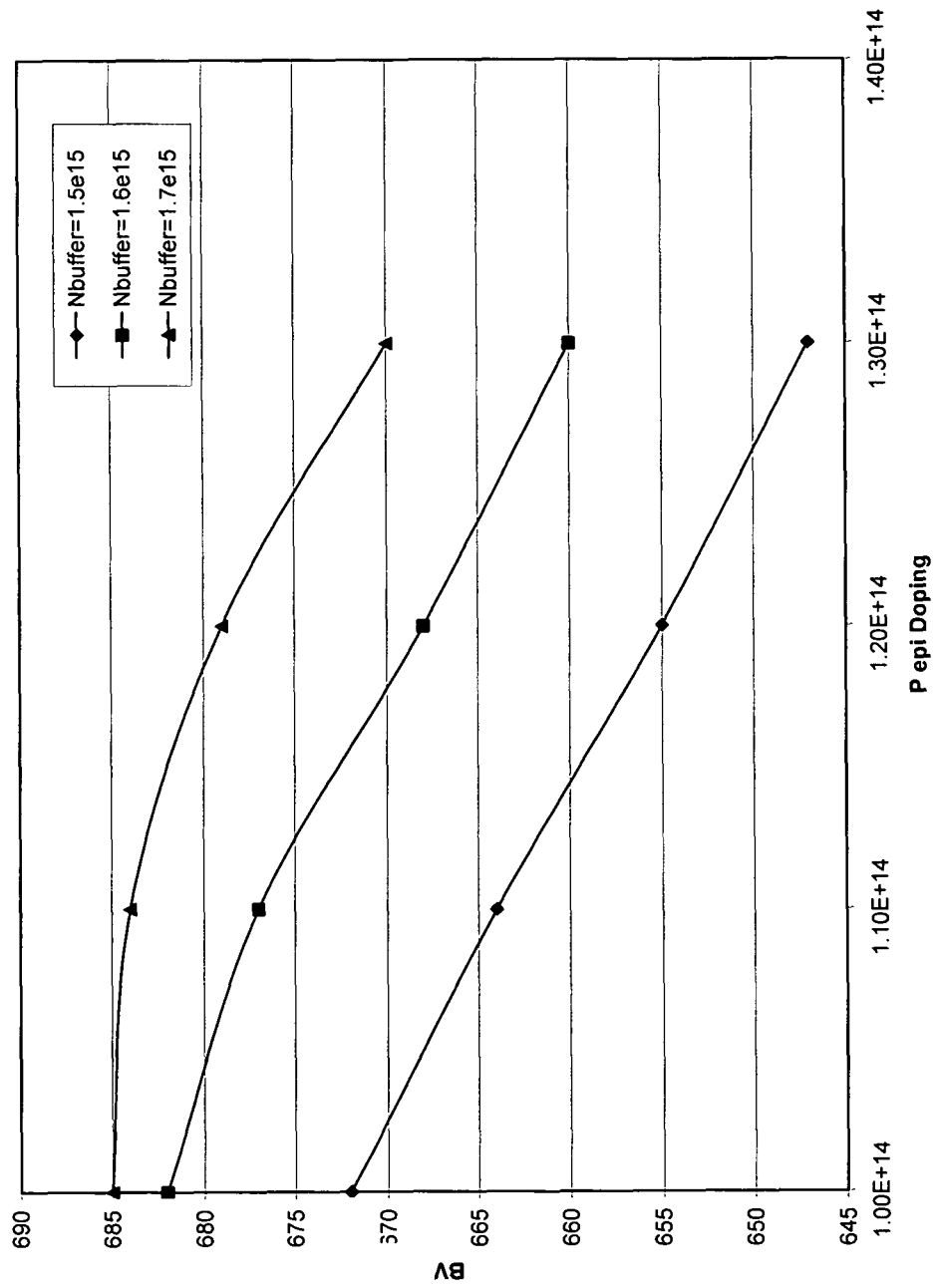

FIG. 2B is a graph of the breakdown voltage BV versus the doping concentration of the buffer layer 160, which shows the manner in which the design of the buffer may be optimized to achieve maximum breakdown. In this example, buffer thickness is set at 5.5 um and the doping level is varied. Peak breakdown is obtained at a buffer doping of 1.5-1.8 E15 cm-3. FIG. 2A is a graph of the thickness of the buffer layer (tbuffer) versus the buffer doping concentration (Nbuffer) which indicates that the same buffer charge may be obtained by using lower doping and greater thickness. FIG. 2C is a graph of the breakdown voltage (BV) vs. the P epi layer (106) doping concentration which shows the typical effect of buffer doping level (Nbuffer) and its interaction with the P– epi doping level for a fixed 5.5 um thick buffer. In the shown data range, increasing the P epi doping concentration decreases the breakdown, and increasing the buffer layer doping concentration increases the breakdown. However if the buffer layer doping concentration is too high, the buffer layer will not deplete. With an optimal choice of buffer doping, a wide process window for P– epi doping is achieved. The different layer thicknesses and doping concentrations can be selected to provide the desired breakdown and operating characteristics.

Figure 3:
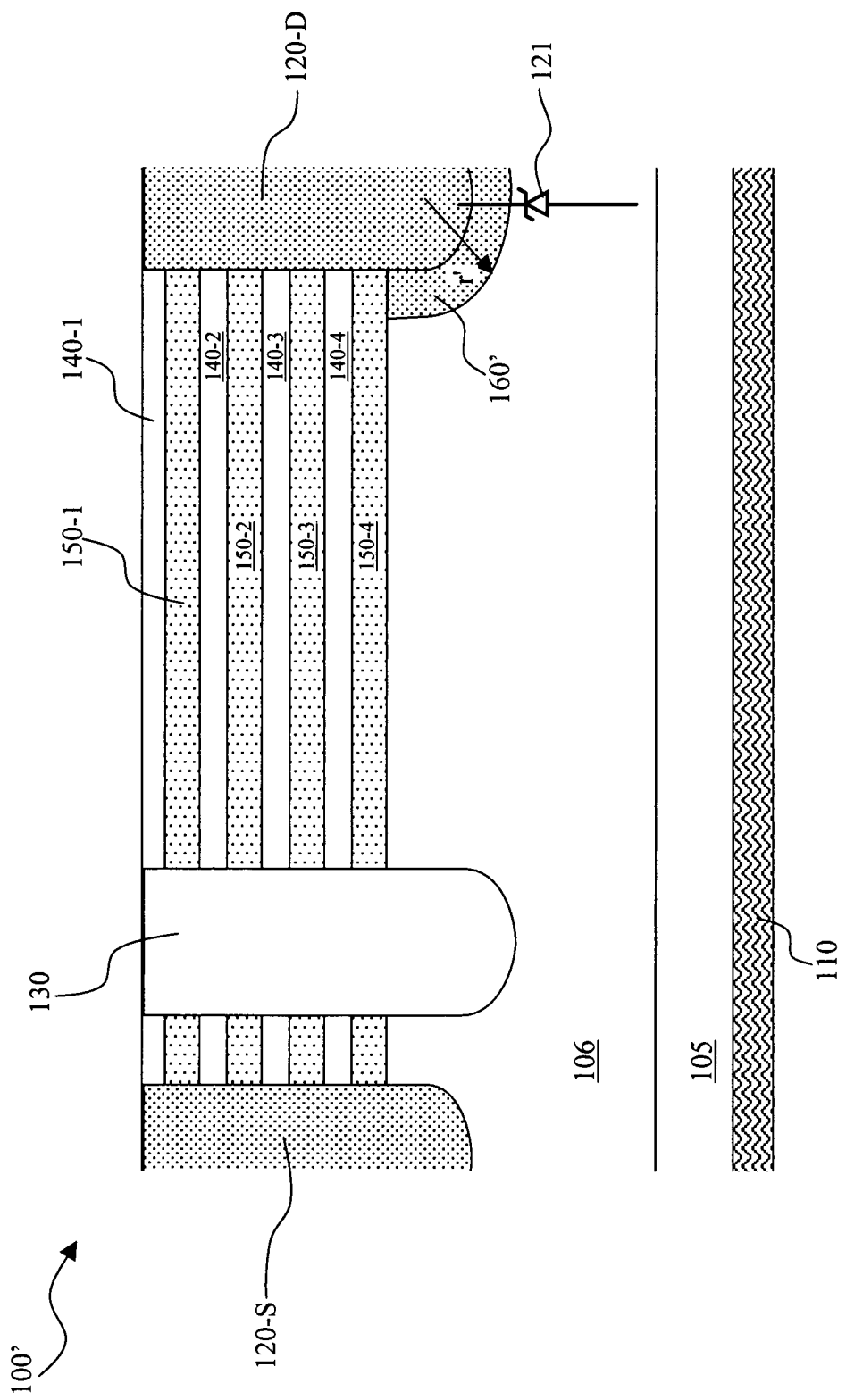
FIGS. 3 and 4 are cross sectional views of lateral power devices with super junction structure as different embodiments of this invention.

FIG. 3 is a cross sectional view of another lateral power device 100' as an alternate embodiment of the present invention. The lateral power device 100' has a similar configuration to the lateral power device 100 shown in FIG. 2. The only difference is the N-buffer layer 160' is now formed as trench bottom buffer layer 160' through N+ implant through the trench bottom after the trench etch process to open the trench of the drain column 120-D. The buried N− buffer layer 160' increases the effective radius of curvature at the bottom of the N+ drain column 120-D to the radius r', which spreads the electric field (i.e., reduced electric field crowding) and improves the breakdown voltage at the bottom of the drain column 120-D. Again, the buried N-buffer layer 160' under the drain column 120-D is formed with dopant concentrations chosen to cause improvement in the breakdown voltage and to divert avalanche current away from the super junction section of the device. After performing the implant for the N-buffer layer 160', the rest of the drain column 120-D may be formed in the drain trench.

Figure 4:
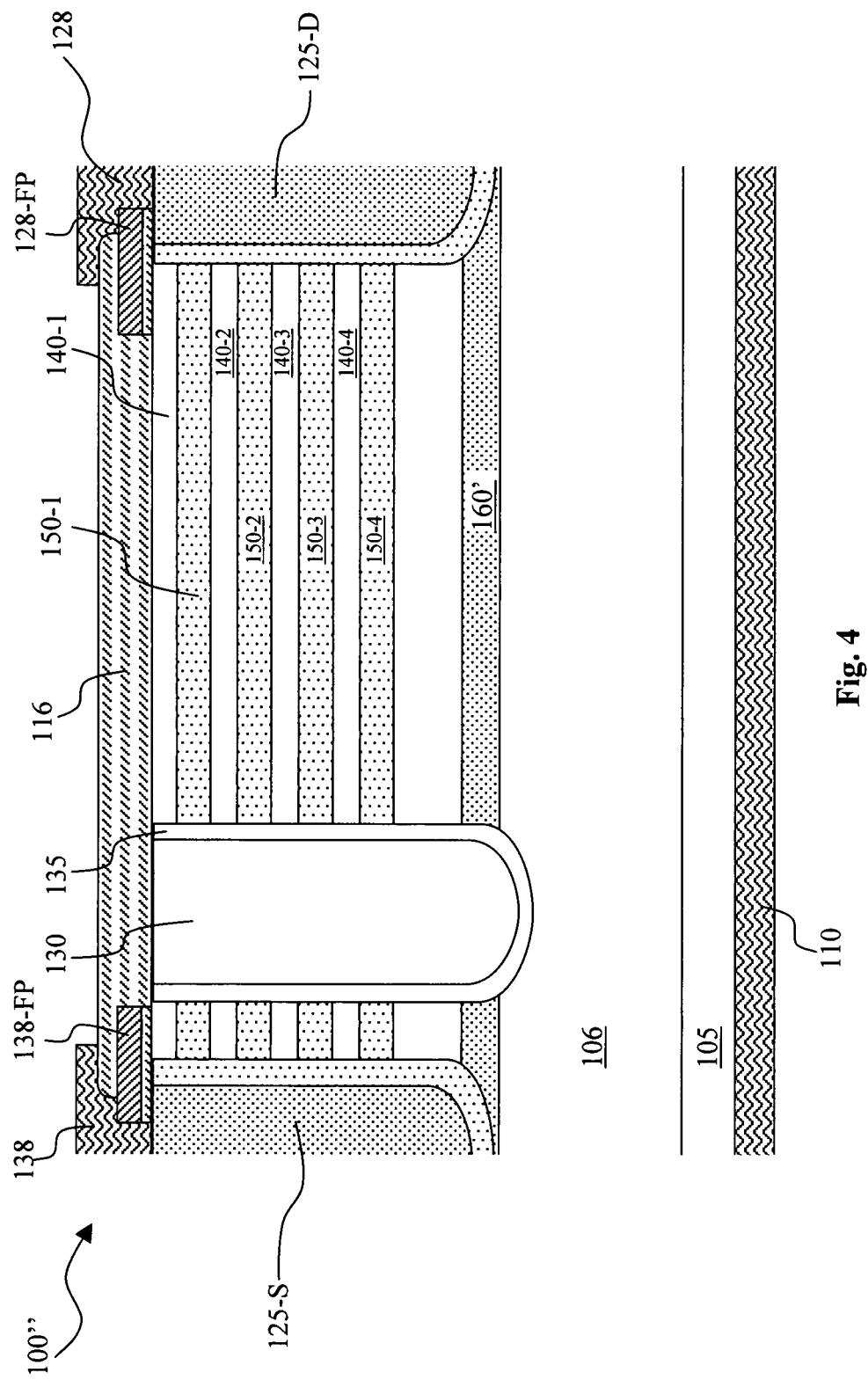

FIG. 4 is a cross sectional view of another lateral power device 100" as an alternate embodiment of the present invention. The lateral power device 100" has a similar configuration as the lateral power device 100 shown in FIG. 2. The difference is that the super junction regions are formed with graded N regions 125-D and 125-S around the N+ drain column 120-D and N+ source column 120-S respectively and graded P dopant region 135 around the P+ gate column 130. The graded regions are formed by diffusion of dopants from the N+ drain columns 120-D, N+ source columns 120-S and P+ gate columns 130, and have lower doping concentration than the columns 120-S, 120-D and 130 in order to prevent increase of the electric field at the deep trenches. The N/P graded regions 125-S, 125-D and 135 effectively push the electric field into the high quality semiconductor material of the super-junction region (e.g., 140-1, 150-1, etc.), rather than within the trenches. This allows a tolerance for voids and defects within the trenches of 120-S, 120-D, 130, which may easily form when filling the trenches. Furthermore, there is a first step field plate 128-FP formed on top of the drain column 120-D under the drain contact 128 and a second field plate 138-FP on top of the source column 120-S under the source contact 138. These field plates prevent the increase of the electrical field at the surface near the edges of the trench regions 120-S and 120-D. The source and drain contact 138, 128 may comprise metal and connect to the source and drain columns 120-S, 120-D respectively through openings in an insulating layer, e.g. thick oxide or borophosphosilicate glass (BPSG). Again, the buried N-buffer layer 160 under the drain is formed with dopant concentrations to maximize the breakdown voltage and to divert avalanche current away from the super junction section of the device.

Figure 5A:
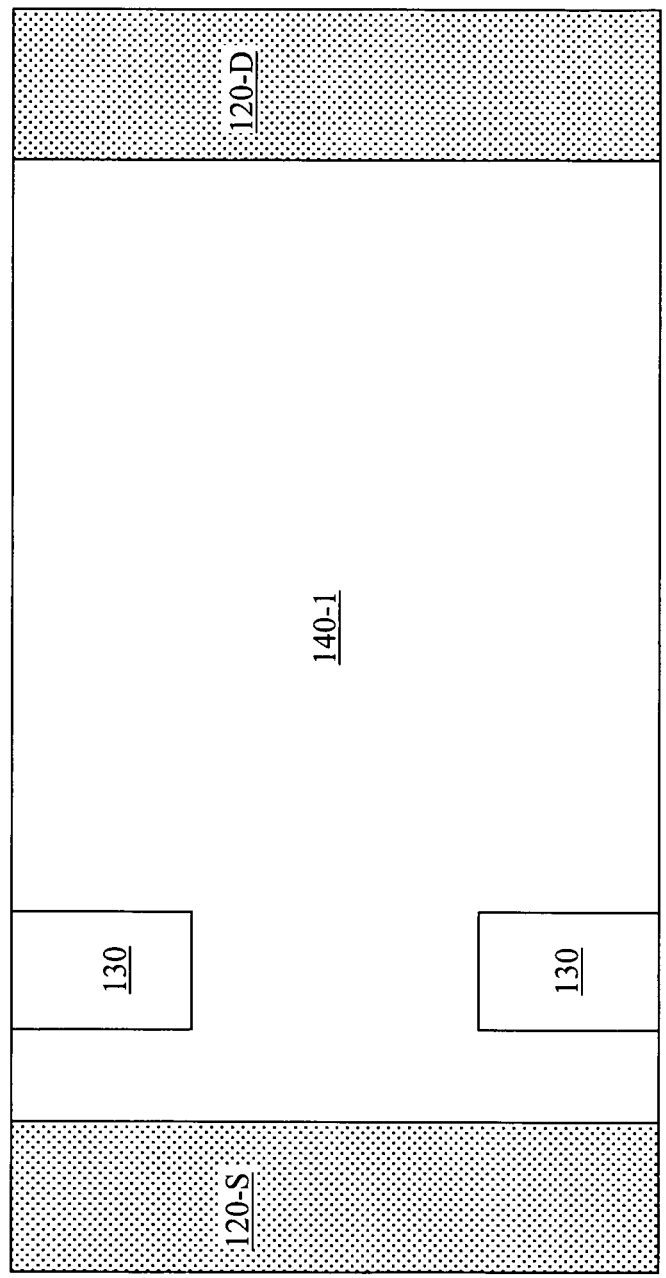
FIGS. 5A to 5C are top views for illustrating different layout configurations for arranging the gate and the drain and source columns in super-junction lateral power devices of this invention.
Figure 5B:
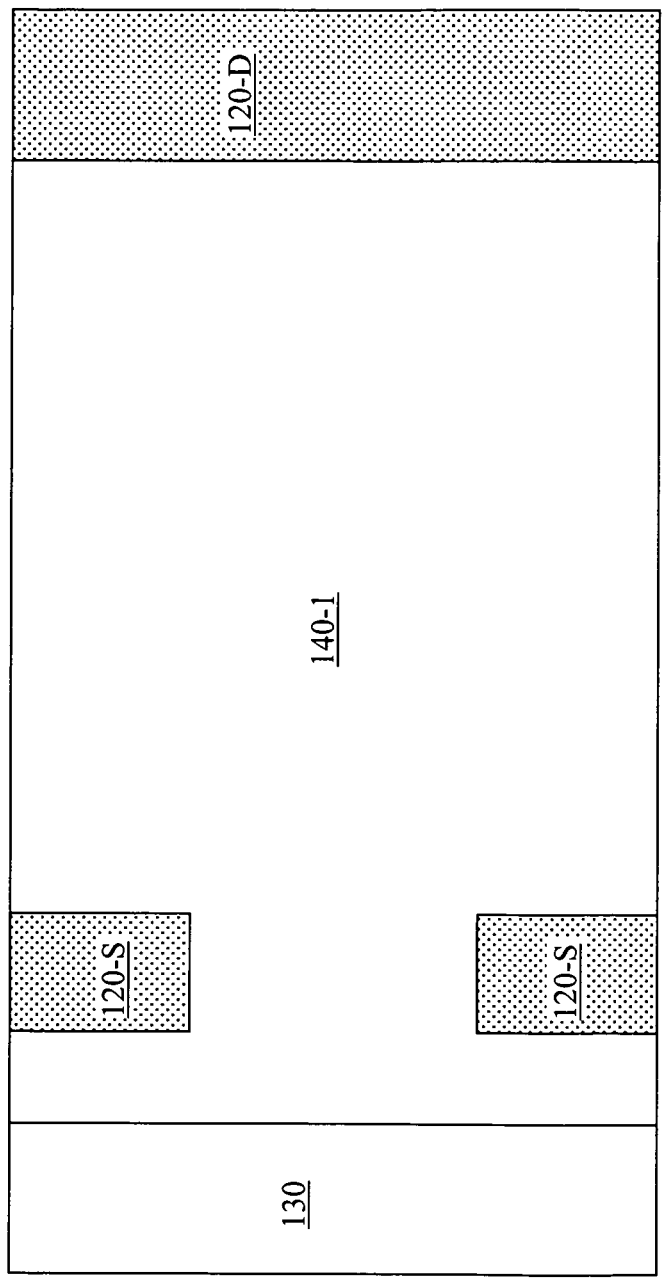
Figure 5C:
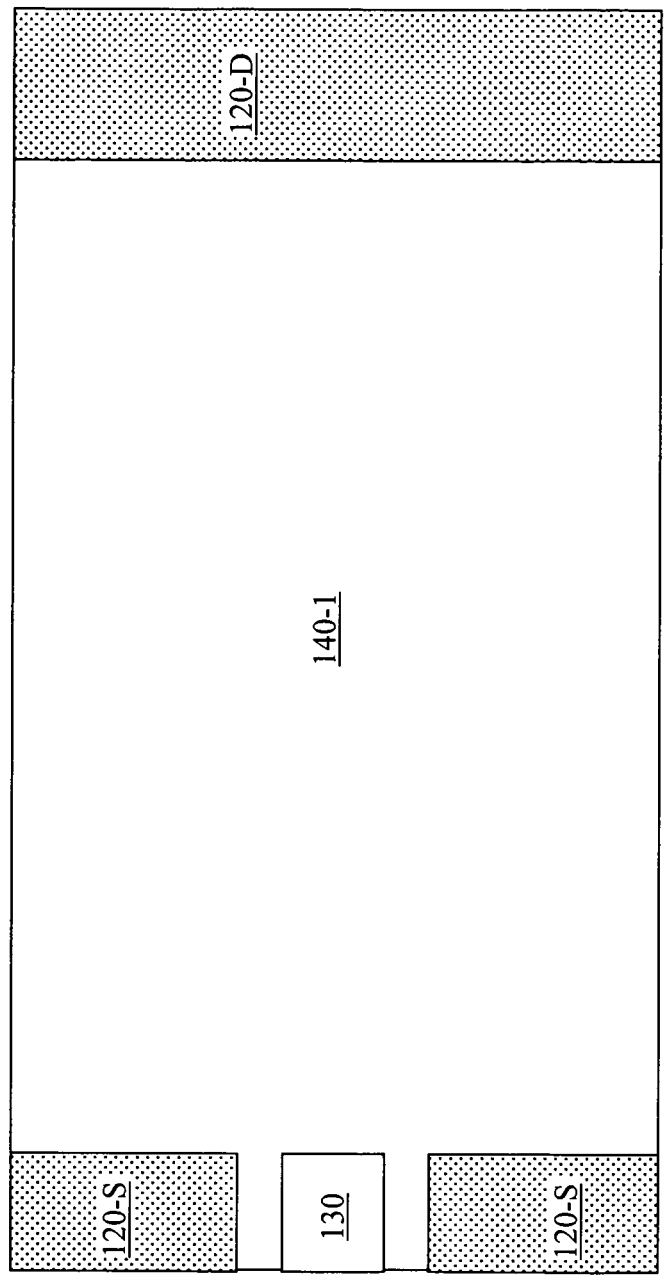

FIGS. 5A, 5B and 5C are three top views for showing three possible configurations for arranging the locations of the P+ gate columns 130 relative to the source and drain 120-S and 120-D formed as N+ doped columns. FIGS. 5A, 5B and 5C show that the source and drain are formed as doped columns on two opposite sides of the substrate 105 (though only top P layer 140-1 is showing over the substrate 105). FIG. 5A shows the gate columns 130 may be formed as P+ doped columns slotted in front of the source columns 120-S such that the P+ columns function as the gate to pinch off the source with a negative gate bias to stop the current flow between the source 120-S to the drain 120-D. FIG. 5B shows N+ columns functioning as source 120-S are slotted in order to allow all the P-layers 150-1, 150-2, . . . , 150-N shown in FIGS. 2 to 4 to be connected to the P− doped gate column 130 functioning as the gate with the gate columns 130 located behind the N+ source columns 120-S to control the electrical current between the source and the drain. In this case, the pinch off is achieved using the depletion of the N-type conduction channels by the P-type charge balance layers in the super junction stack. The P-doped gate column 130 serves to connect all the P-layers of the super-junction stack to a common gate potential to facilitate this pinch-off by the application of a reverse bias between gate and source. The configuration of the device in FIG. 5B may be able to reduce the path between the source and the drain, thus reducing the on resistance Rds-A. FIG. 5C shows a variant of the structure shown in FIG. 5B, which interdigitates the source and gate trenches 120-S, 130. This technique is useful for minimizing the cell pitch of the lateral device contributing to improved Rds-A.

Figure 6:
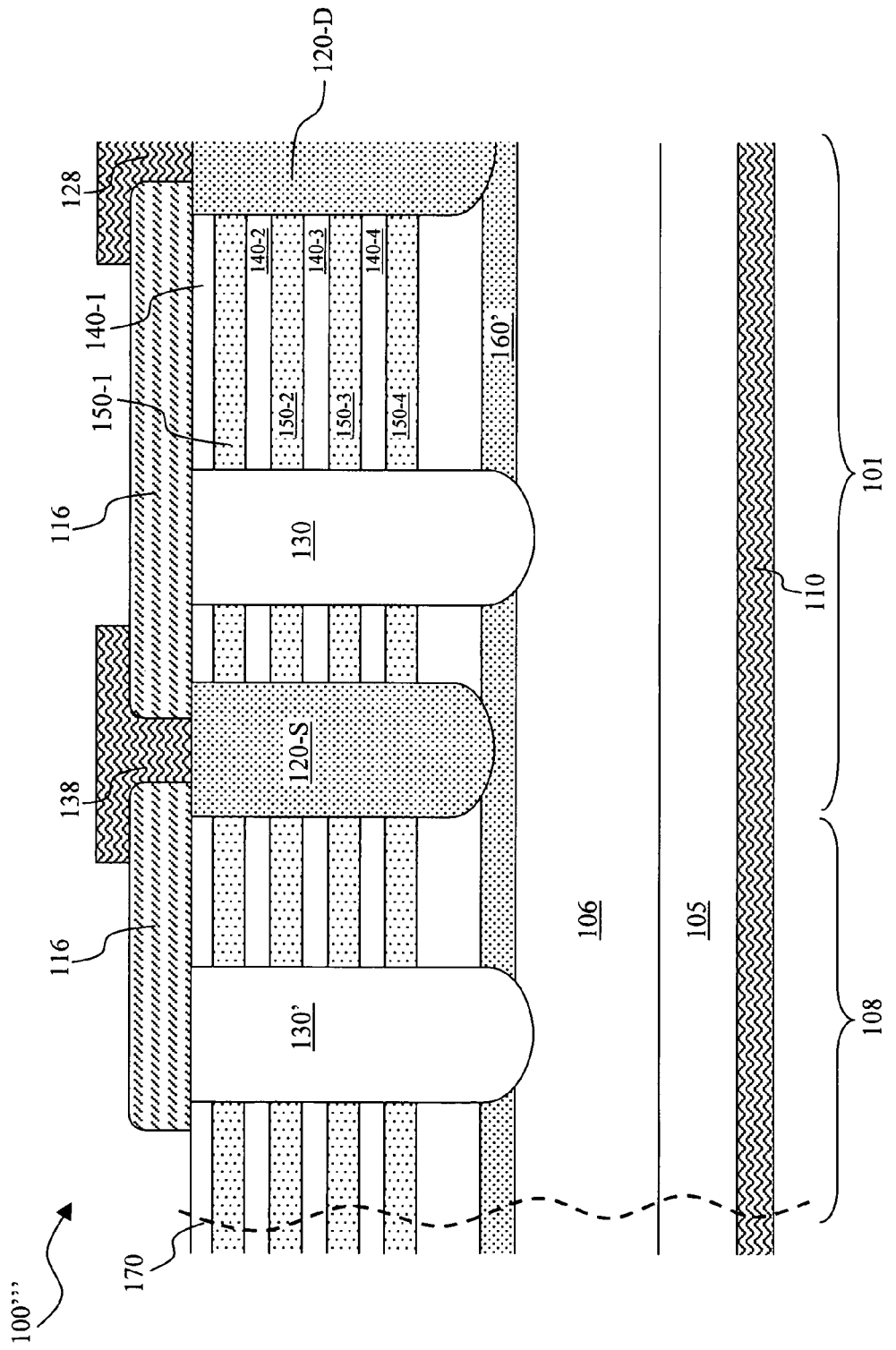
FIG. 6 is a cross sectional view for showing the termination area of the lateral power device with super junction of this invention.

FIG. 6 is a cross sectional view of a lateral power device 100''' with a super-junction structure in the active area 101 as shown in FIGS. 2 to 4. The lateral power device further includes a termination P column 130' formed in the termination area 108 near a die edge 170 provided for dicing the semiconductor wafer into individual chips. The termination P-column 130' may be formed during the same process as the formation of the P+ gate columns 130 of the active area 101. The termination P-column 130' may formed as a ring around the active area 101 in the periphery/termination are 108 of the device between the active area 101 and the die edge 170. The termination P-column 130' prevents shorting between the N+ source column 120-S and the substrate at the termination region, which might occur while sawing the device to form the die edge 170.

Figure 7B:
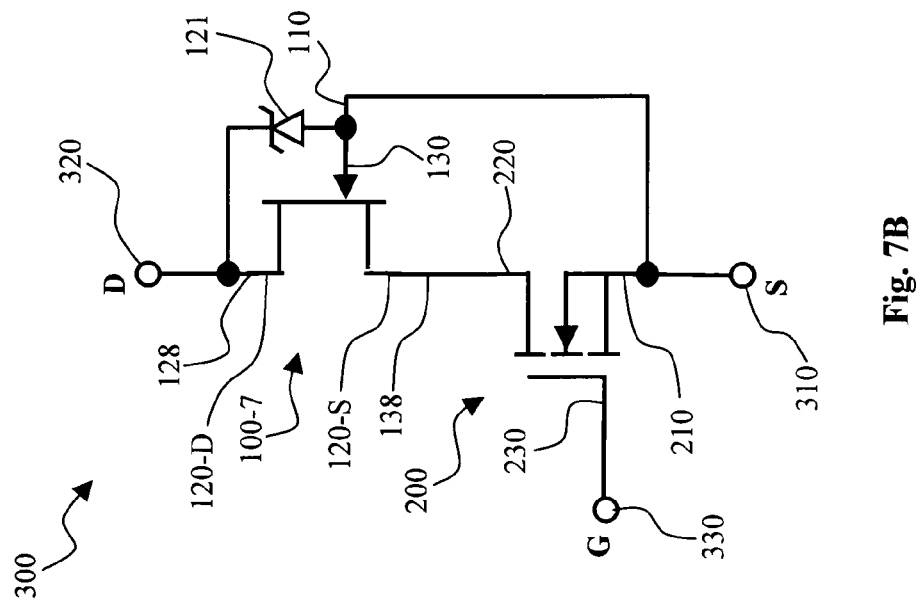
FIGS. 7A and 7B are a top view and a circuit diagram respectively for showing a packaging configuration and circuit connections of a power device of this invention.
Figure 7A:
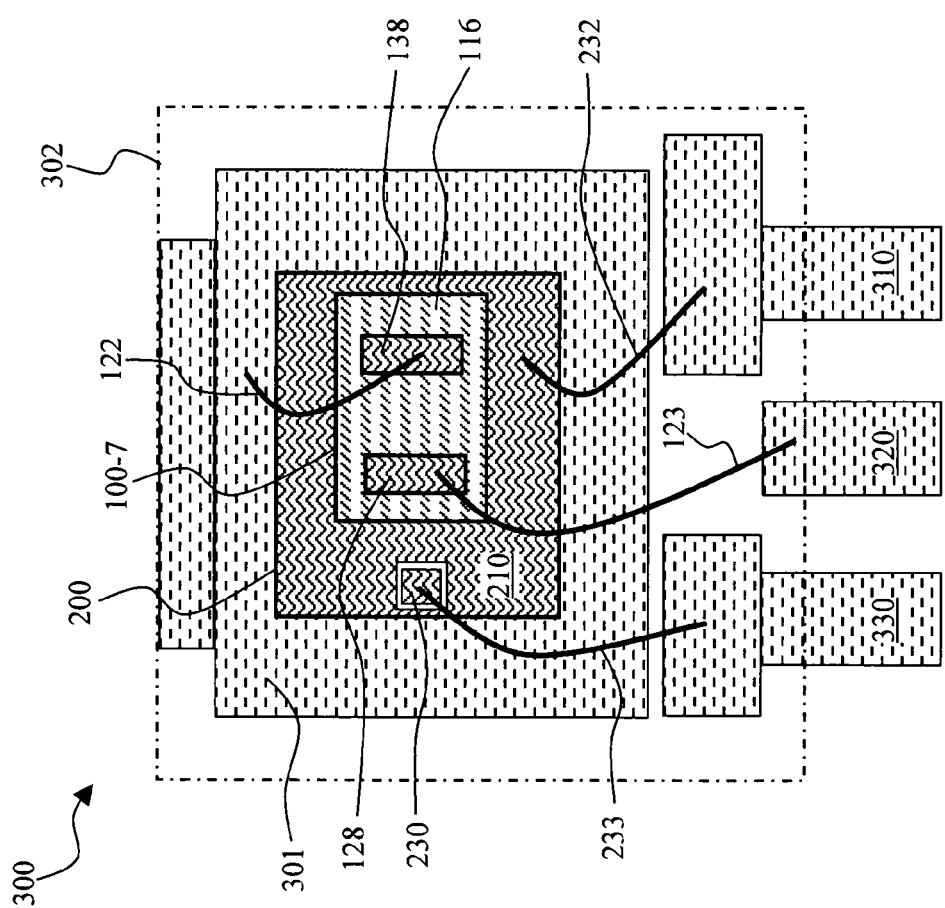

Referring to FIGS. 7A and 7B for a top view and circuit diagram of a package 300 with cascode connection of a high-voltage (HV) lateral super-junction (SJ) field effect transistor (JFET) 100-7 of this invention (e.g., the SJ JFETs of FIGS. 2-6) placed on top of a MOSFET device 200 that has a greater die size. The gate metal layer 110 of the HV SJ-FET 100-7 (not shown in FIG. 7A), being located on the bottom of the HV SJ JFET 100-7 die, is directly mounted on and in physical contact with the source metal layer 210 of the MOSFET device 200. The gate 230 of the MOSFET device 200 is connected to a gate terminal 330 through a bonding wire 233. The drain terminal 128 contacting drain column 120-D of the HV SJ-JFET 100-7 is connected to a drain terminal 320 through a bonding wire 123 and the source electrode 138 contacting source column 120-S of HV SJ-JFET 100-7 is connected to the drain electrode 220 of the MOSFET device 200 through a bonding wire 122 by way of die pad 301. The drain electrode 220 (not shown in FIG. 7A) of the MOSFET device 200, being located on the bottom of the MOSFET device 100-7, is mounted onto the die pad 301 of the package 300. It is connected to the source pad 138 of the HV JFET device 210 by bonding wire 122. The source of the MOSFET device 200 through bonding wire 232. The outline of the molding encapsulant is indicated by the dashed line 302. This package 300 with the cascode circuit configuration shown in FIG. 7B is operated as a normally off power switch. The cascode circuit illustrated in FIG. 7B allows for a normally on JFET 100-7 to be controlled by a normally off MOSFET 200, effectively making the overall device in the package 300 a normally off power switch having a gate 330, drain 320 and source 310. The JFET 100-7 includes a built-in avalanche diode 121 of this invention likes those shown in FIGS. 2-4. The JFET 100-7 may be a high voltage super junction device to provide high voltage blocking while the controlling MOSFET may be a simple low voltage device. In many applications a normally off power switch is preferred over a normally on power switch for various reasons including the device being off at circuit start-up, compatibility with existing designs, and familiarity. This configuration helps to minimize on resistance degradation from the series low voltage MOSFET, since a large low voltage MOSFET 210 may be used, while the stack arrangement minimizes the size of the package needed to achieve a target on-resistance.

Figure 8B:
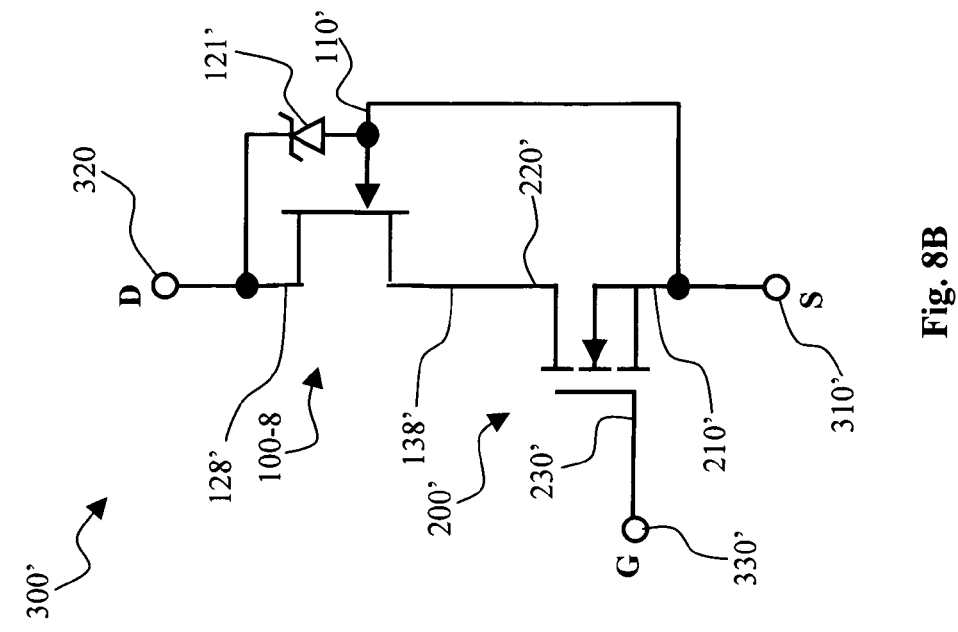
FIGS. 8A and 8B are a top view and a circuit diagram respectively for showing a packaging configuration and circuit connections of an alternate power device of this invention.
Figure 8A:
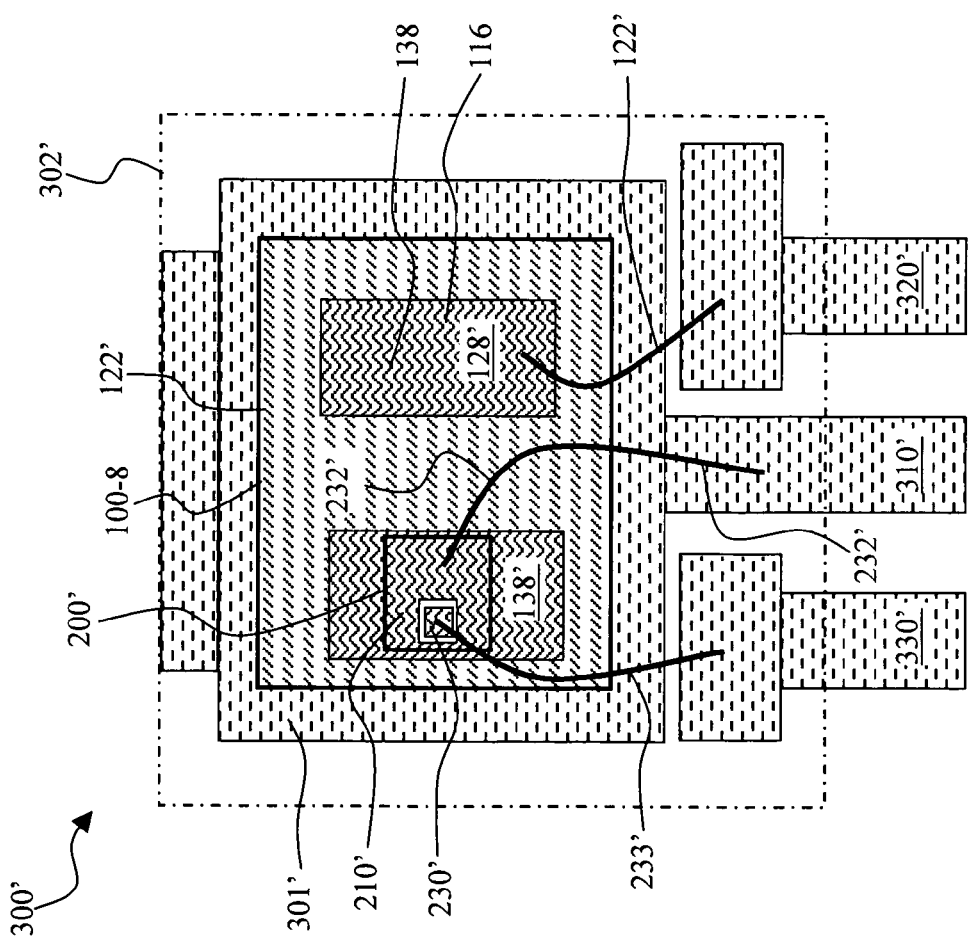

FIGS. 8A and 8B are a top view and circuit diagram of a package 300' with a cascode connection between a high-voltage (HV) lateral super-junction (SJ) junction field effect transistor (JFET) 100-8 of this invention placed on a die paddle 301' of package 300'. The HV lateral SJ-FET 100-8 has a greater die size to support a smaller MOSFET device 200' that has a bottom drain electrode 220' (not shown in FIG. 8A) directly mounted on a source electrode 138' of the HV JFET 100-8. The gate 230' of the MOSFET 200' is connected through bonding wire 233' to a gate terminal 330' and the source electrode 210' of the MOSFET 200' is connected to a source terminal 310' through another bonding wire 232'. The drain electrode 128' of the HV SJ-FET 100-8 is connected to a drain terminal 320' through the bonding wire 122' The bottom of the HV SJ JFET 100-8 further has a bottom gate electrode 110' (not shown in FIG. 8A) which is mounted onto the die paddle 301'. The die paddle is connected to the source electrode 310', thus providing connection between the source metal 210' of the MOSFET 200' and the gate 110' of the HV SJ JFET 100-8. The outline of the molding encapsulant is indicated by dashed line 302'. Similar to FIGS. 7A and 7B, the package 300' is also in a cascode circuit configuration, as shown in FIG. 8B. The JFET 100-8 includes a built-in avalanche diode 121' as shown in FIGS. 2-4. In this configuration, the on-resistance of the high voltage device may be minimized, since a large die may be placed within a package. The stacking of the low voltage MOSFET 200' on the HV SJ-JFET 100-8 makes the best use of the available die pad area in the package 302'. Furthermore, since the majority of the heat is dissipated in the HV SJ-JFET, this configuration allows the direct transfer of heat from the HV SJ-JFET 100-8 die to the heat sink via the die pad 301'. This configuration also allows a direct current flow path for the clamping Zener diode 121' to the die pad 301'. Since the Drain of the low voltage MOSFET 200' is in direct contact with the Source of the HV SJ-JFET 100-8, the inductance is minimized in the main current flow path of the power device. These are the advantages of the configuration of FIG. 8A.

According to FIGS. 7A, 7B and 8A and 8B, this invention further discloses an electronic package. The electronic package includes a low voltage (LV) metal oxide semiconductor field effect transistor (MOSFET). The electronic package further includes a high voltage (HV) super junction JFET (SJ-JFET) having a bottom gate electrode and a top source and drain electrodes and wherein the LV-MOSFET and HV SJ-JFET packaged with a cascode connection with a gate of the HV SJ-JFET connected to a source of the LV MOSFET and a source of the HV SJ-JFET connected to a drain of the LV MOSFET. The HV SJ MOSFET and the LV MOSFET are in a stacked configuration. In one embodiment, the LV MOSFET having a greater die area with a top source metal for directly mounting a bottom gate electrode of the HV SJ-JFET thereon; and a lead frame includes a paddle for placing the LV MOSFET thereon. In another embodiment, the HV SJ-JFET having a greater die area with a top source metal for directly mounting a bottom drain electrode of the LV MOSFET thereon; and a lead frame includes a paddle for placing the HV SJ-JFET thereon.

Figure 9:
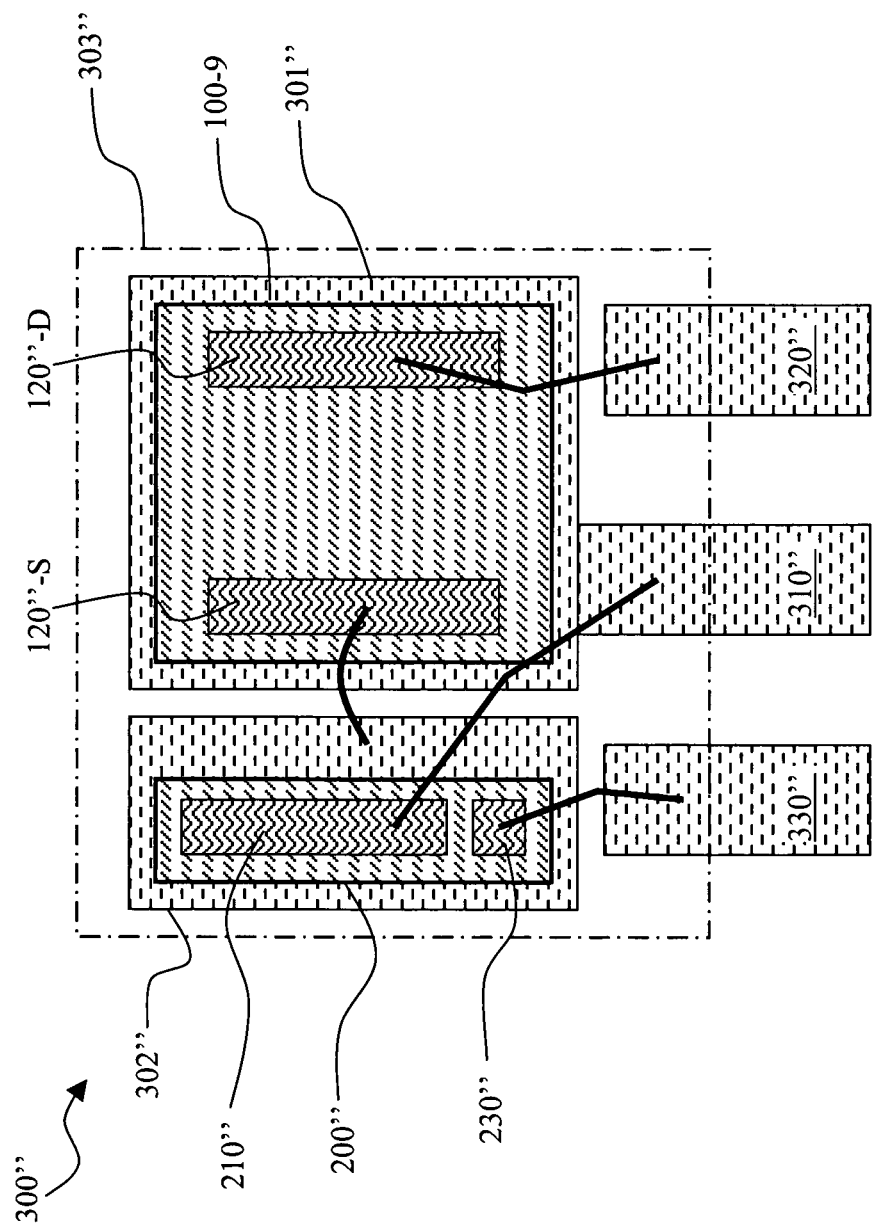
FIG. 9 is a top view for showing a packaging configuration of an alternate power device of this invention.

FIG. 9 shows another co-packaging possibility for a HV lateral SJ JFET 100" to be co-packaged side by side with a low voltage MOSFET 200" in an alternative package 300", the HV SJ JFET 100-9 being made according to the embodiments of this invention. The HV SJ JFET 100-9 is again co-packaged with MOSFET 200" in a cascode configuration, but in this case is co-packaged side by side, rather than in a stacked configuration. The bottom gate (not shown) of the JFET 100-9 is mounted onto a first die paddle 301" of the package 300". The first die paddle 301" is also connected to the source electrode 310" of the package 300". The source electrode 310" is also connected to a source metal 210" of the MOSFET 200" by a bond wire. The gate electrode 330" is connected to the gate metal 230" of the MOSFET 200". The bottom drain (not shown) of the MOSFET 200" is mounted onto second die paddle 302". The second die paddle 302" is also connected to the source metal 120"-S of the JFET 100-9 by a bond wire. And the drain metal 120"-D of the JFET 100-9 is connected to the drain electrode 320" by a bond wire. The package 300" is covered with a molding encapsulant having an outline indicated by the dashed line 303".

FIGS. 10A to 10D show the processes to form the alternate P-layers and N-layers of the lateral super junction structure. In FIG. 10A, a target P epitaxial layer is grown to form the P doped epitaxial layer 40-1 layer having a charge of about 2 e12 cm$^{-2}$. In FIG. 10B, a target N epitaxial layer is grown on top of the P doped epitaxial layer 40-1 to form the N doped epitaxial layer 50-1 having a charge of about 2 e12 cm$^{-2}$. These steps are repeated in FIGS. 10C and 10D to epitaxially grow P epitaxial layer 40-2 and N epitaxial layer 50-2. These steps are repeated as necessary to form the rest of the alternating N and P layers of the lateral super junction structure. Such an alternating sequence of epitaxial layers may be readily grown using a dual chamber epitaxial reactor known to those skilled in the art. Note that the charge in the top and bottom p-layers of the super-junction stack usually have a charge of 1 E12 cm$^{-2}$, or half the normal layer charge, to achieve the proper charge balance.

FIGS. 11A to 11D show alternative processing steps to form the alternate P-layers and N-layers. In FIG. 11A, a target epitaxial layer 41 is grown to form the P-doped epitaxial layer 41 having a charge of about 2 e12 cm$^{-2}$. In FIG. 11B, a screen oxide layer 142 is deposited on the top surface of the P doped epitaxial layer 41, and a low energy N type implant is performed to form the N type layer 50-1 at the top of P doped epitaxial layer 41, leaving the bottom portion of P doped epitaxial layer 41 as P type layer 40-1. In FIG. 11C, the screen oxide 42 is removed and the process is repeated, starting with growing a P-doped epitaxial layer 42 over the N type layer 50-1 having a charge of about 2 e12 cm$^{-2}$. Another screen oxide 142 is formed on top of P-doped epitaxial layer and an N-type implant if performed at the top to form N type layer 50-2 and P type layer 40-2. These steps are repeated as necessary to form the rest of the alternating N and P layers of the lateral super junction structure as shown in FIG. 11D. The opposite can be carried out, by growing a target N-doped epitaxial layer, and then performing a low energy P type implant to form a P type layer at the top and leave an N type layer at the bottom. Implantation is a mature manufacturing process which allows for very fine control of the dopant concentrations of the doped layers. By way of example, an arsenic implant may be used to form the N-doped layer 50-1 and 50-2.

FIGS. 12A to 12D show alternative processing steps to form the alternate P-layers and N-layers. In FIG. 12A, a lightly doped P type epitaxial layer 45 with resistivity of approximately 100 Ohm-cm or greater is grown. Alternatively the lightly doped epitaxial layer 45 may be N type or intrinsic semiconductor material. This is followed by forming a screen oxide layer 142 on the top surface of the lightly doped P epitaxial layer 45 and carrying out a blanket high energy boron implant to form the P doped epitaxial layer 40-1 followed by carrying out a low energy implant of antimony or arsenic to form the N-doped layer 50-1. In FIG. 12C, the screen oxide layer 142 is stripped, and a second epitaxial layer 46 is grown with the same characteristics as layer 45. In FIG. 12D, the screen oxide 142 is formed on the substrate, and the Boron and Arsenic implants are repeated to form the P and N layers 40-2 and 50-2 respectively. These steps are repeated as necessary to form the rest of the alternating N and P layers of the lateral super junction structure. Though this process is done by implanting two layers per epitaxial growth, the same structure can also be formed with one implantation per epitaxial growth, or with more than two implantations per epitaxial growth. Again, the charge in the top and bottom P-layers of the super-junction stack usually have a charge of 1 E12 $cm^{-2}$, or half the normal layer charge, to achieve the proper charge balance.

These alternating P layers and N layers 40-1, 50-1, etc., may be formed as described above efficiently and quickly, without the use of masks. These alternating P layers and N layers 40-1, 50-1, etc. may be formed on top of a P+ substrate and a P-Epitaxial layer, such as P+ substrate 105 and P− Epitaxial layer 106 of FIG. 2. An N buffer layer such as N buffer layer 160 of FIG. 2 may also be formed from implantation or epitaxial growth in similar manner as described above.

Figure 13A:
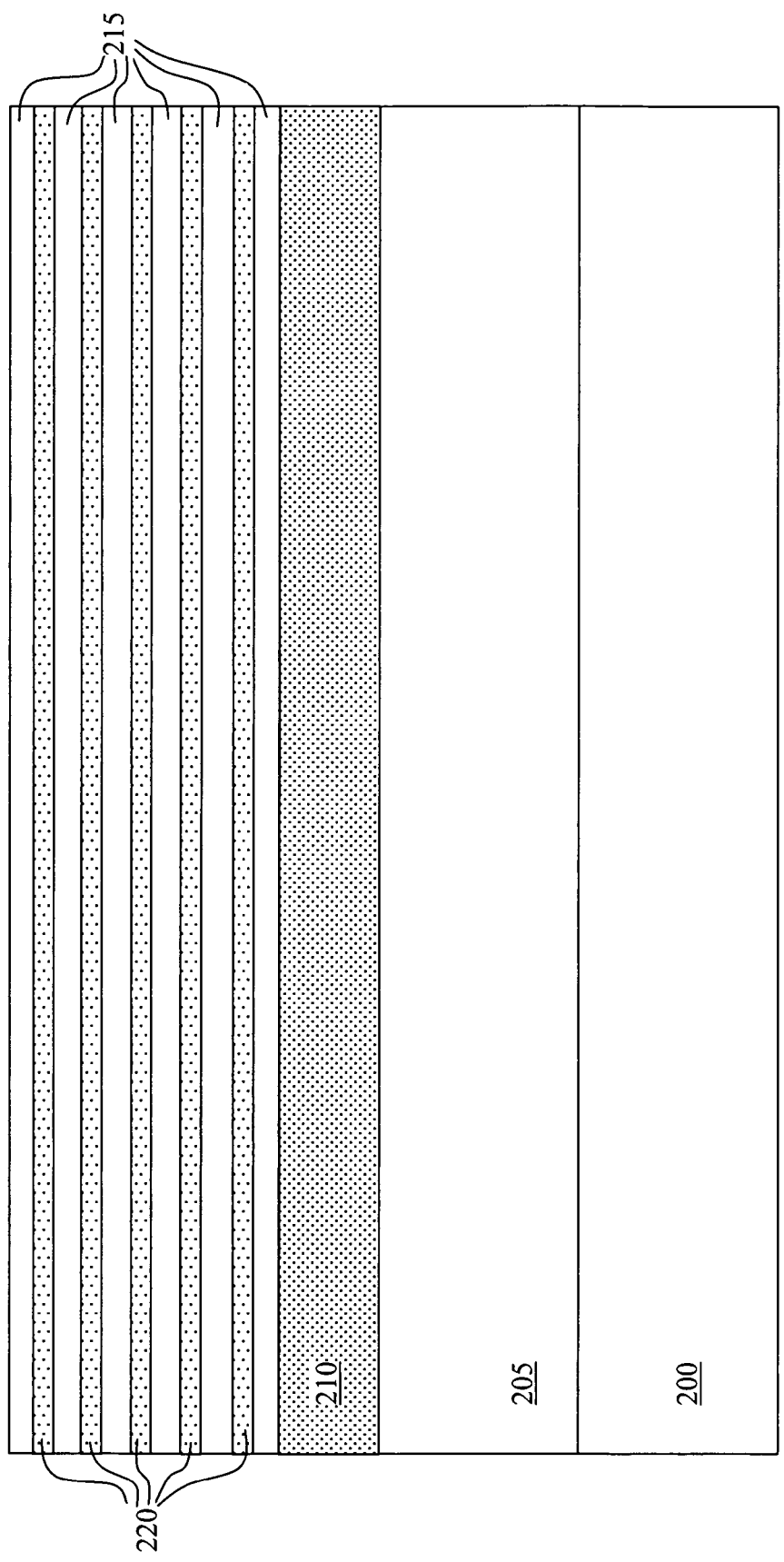
FIGS. 13A to 13N are a cross sectional views to illustrate processing steps of this invention to manufacture super-junction lateral power device of FIG. 2 of this invention.
Figure 13B:
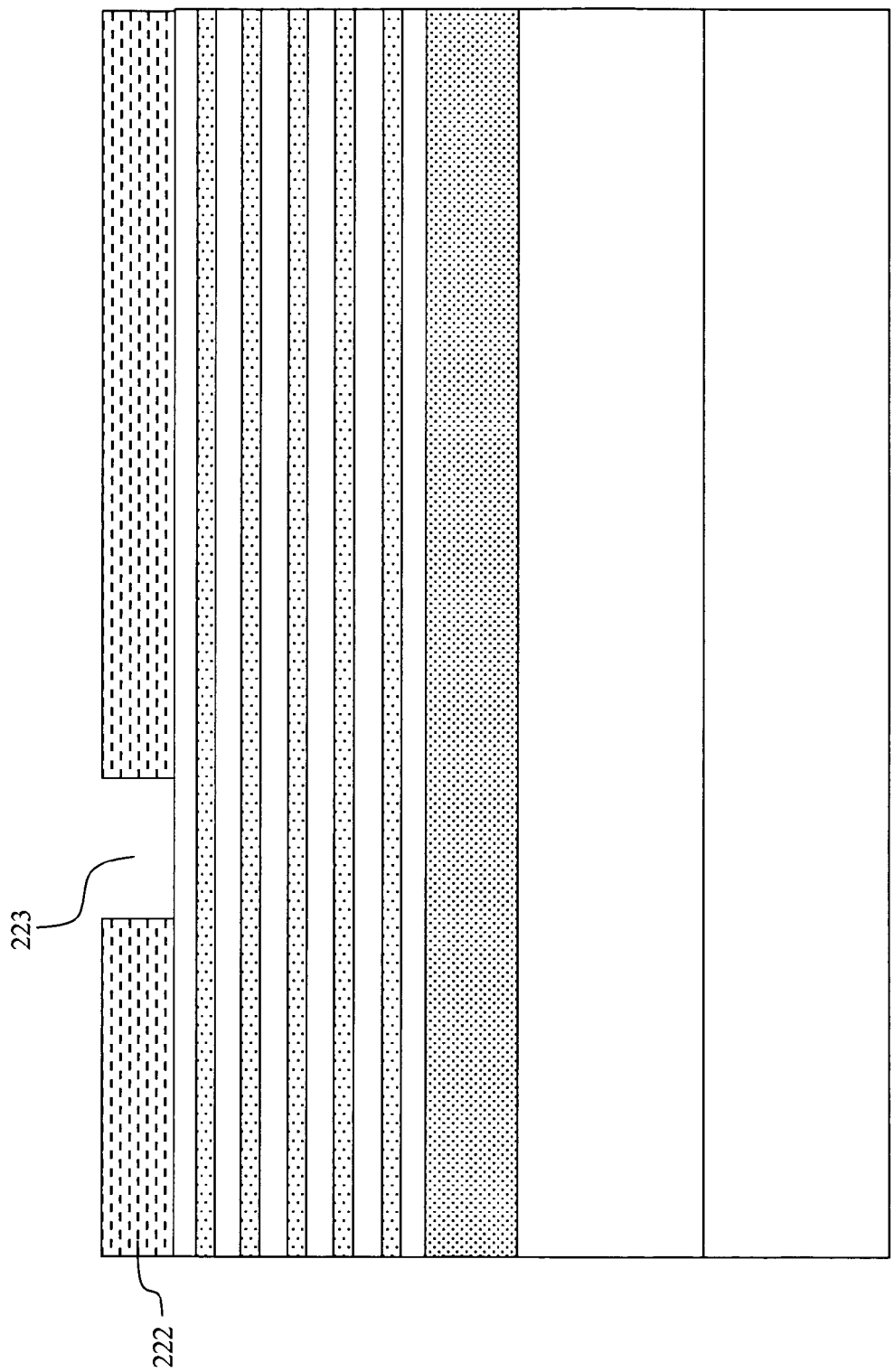
Figure 13C:
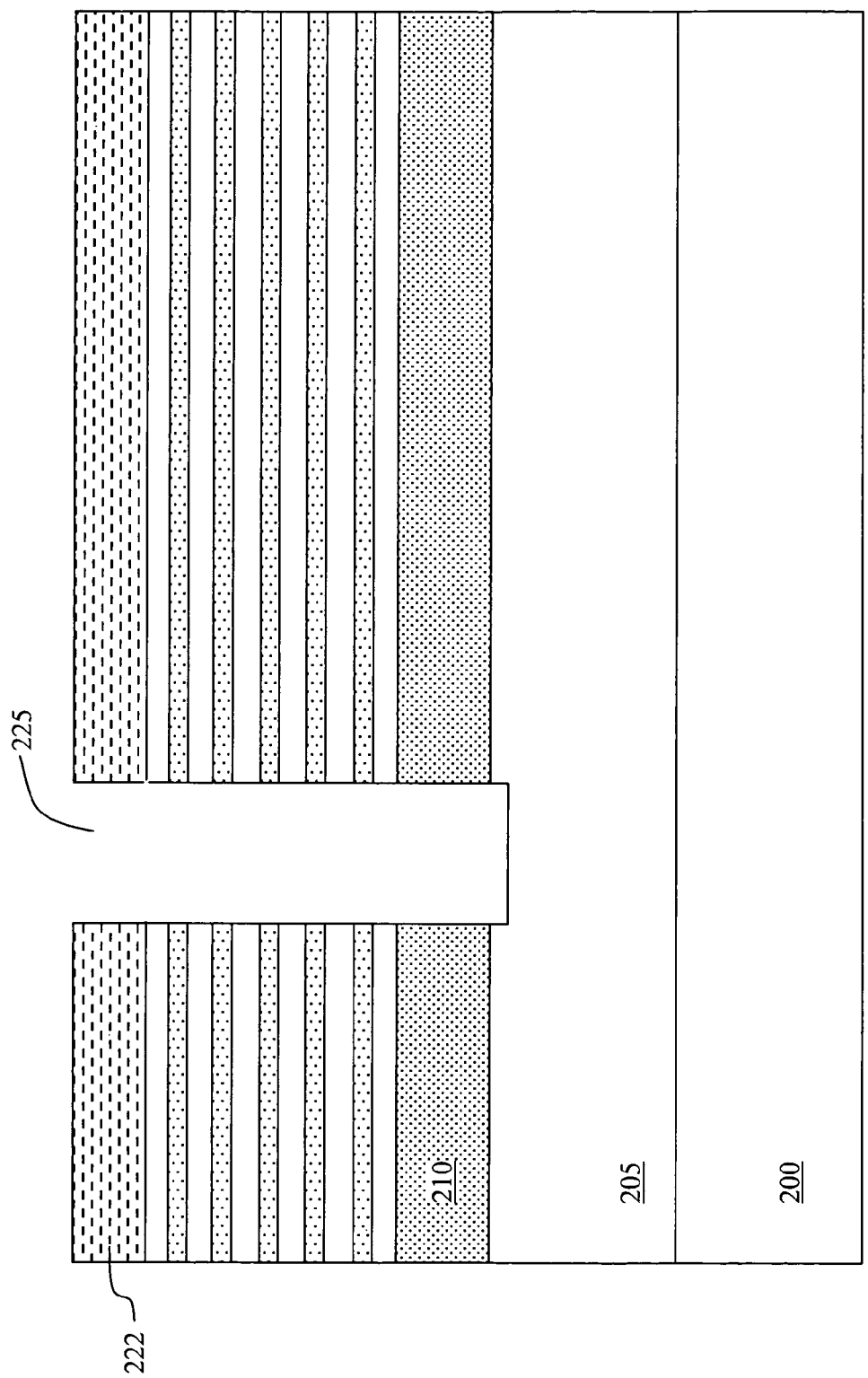
Figure 13D:
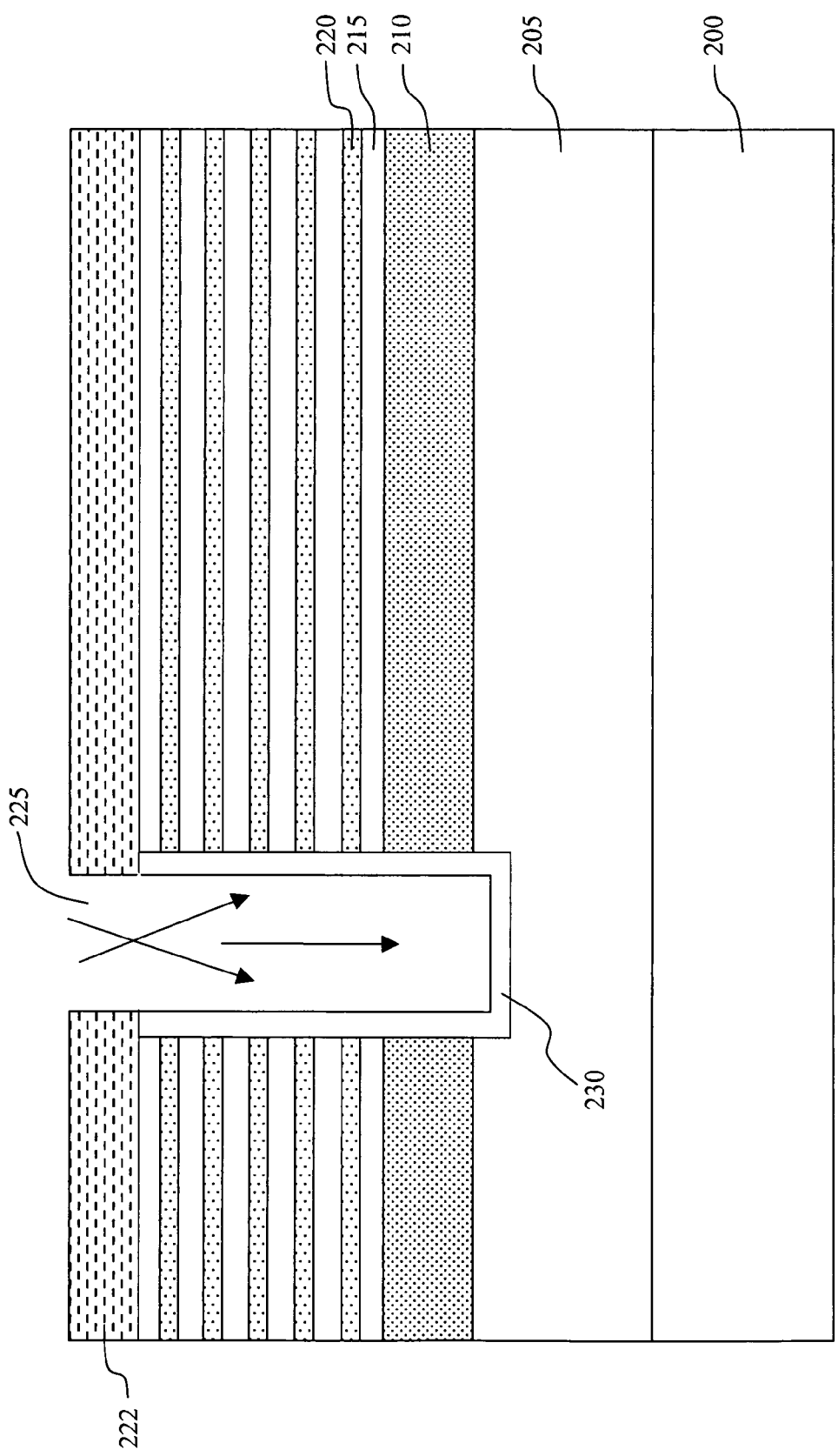
Figure 13E:
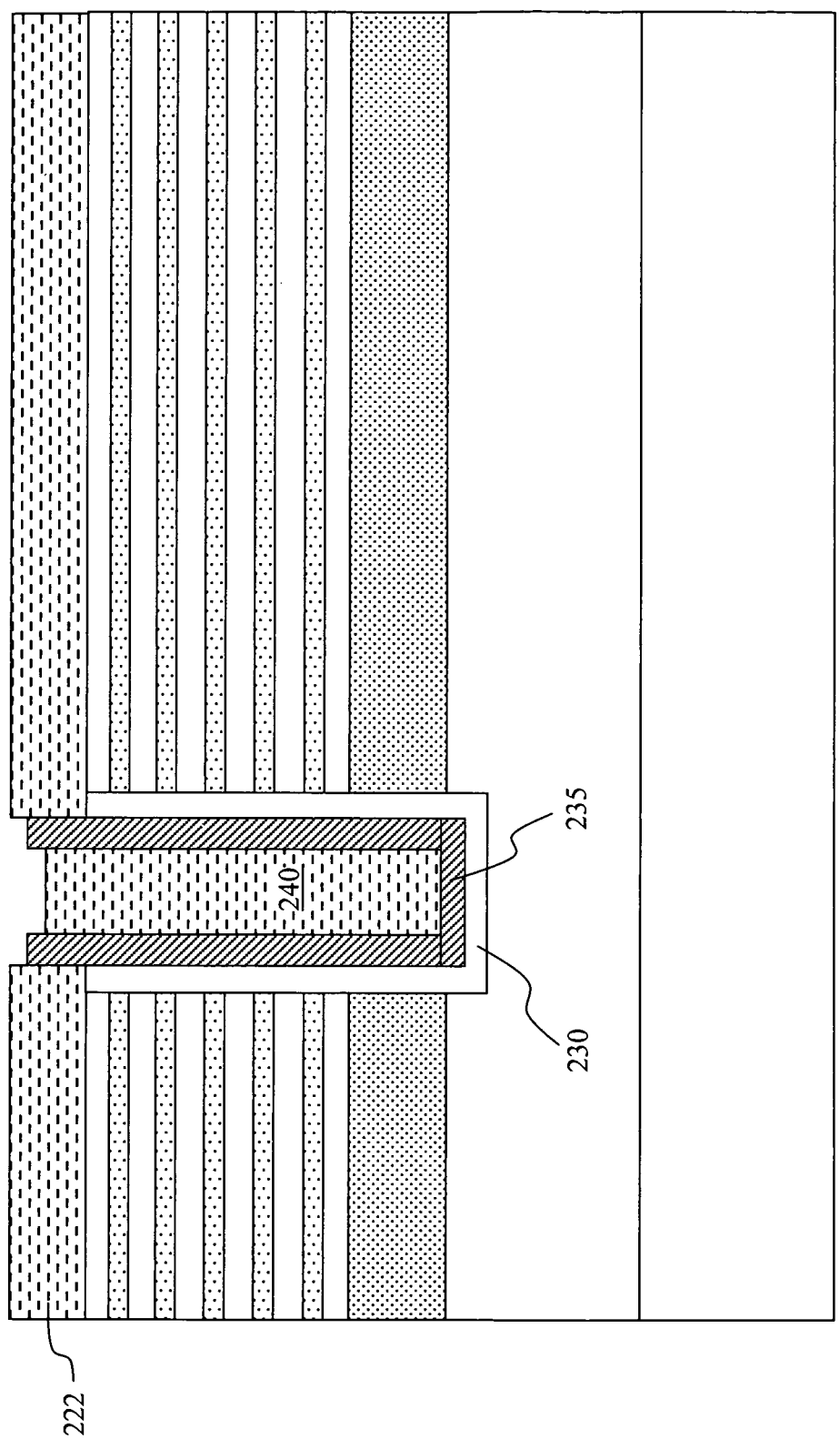
Figure 13F:
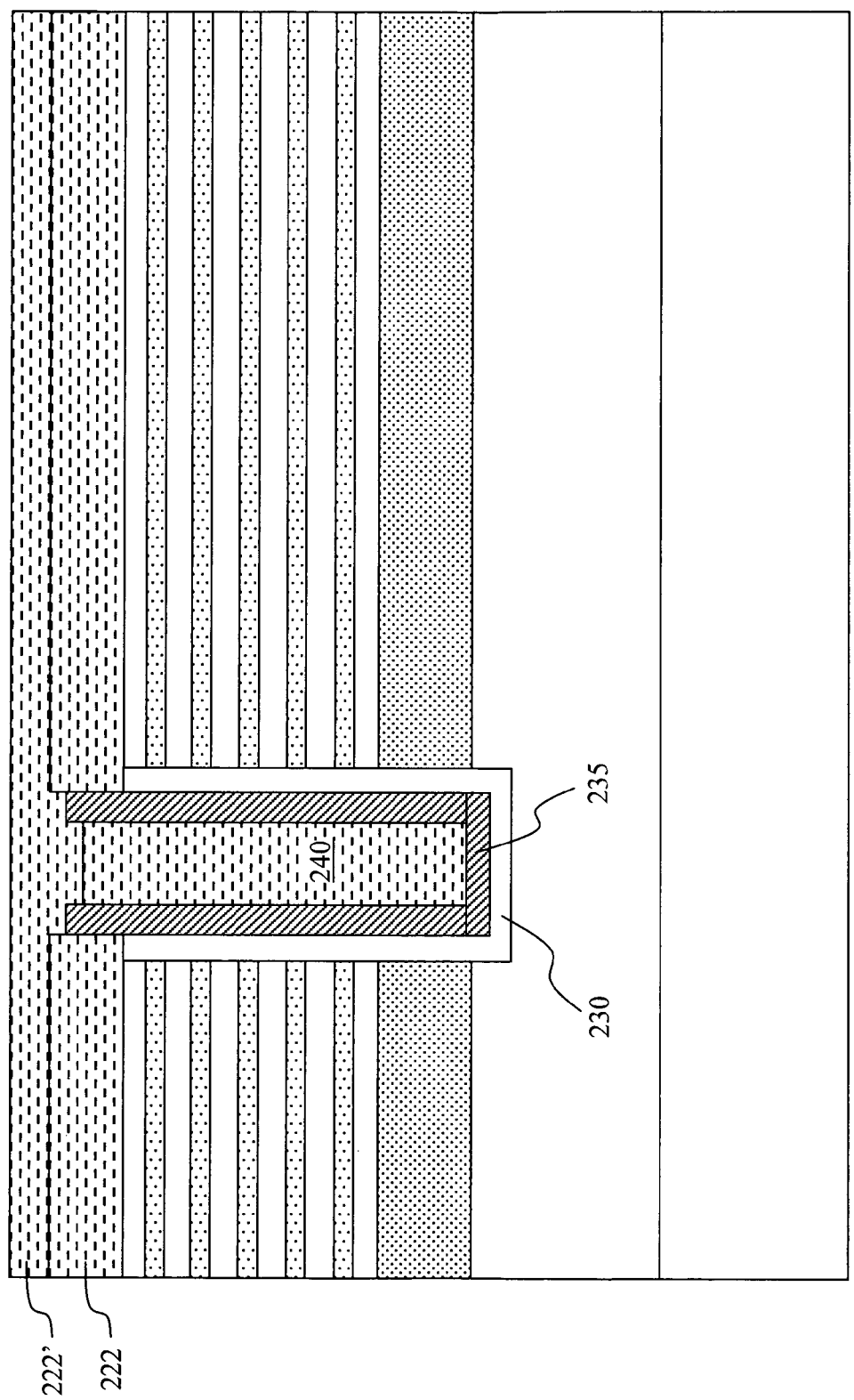
Figure 13G:
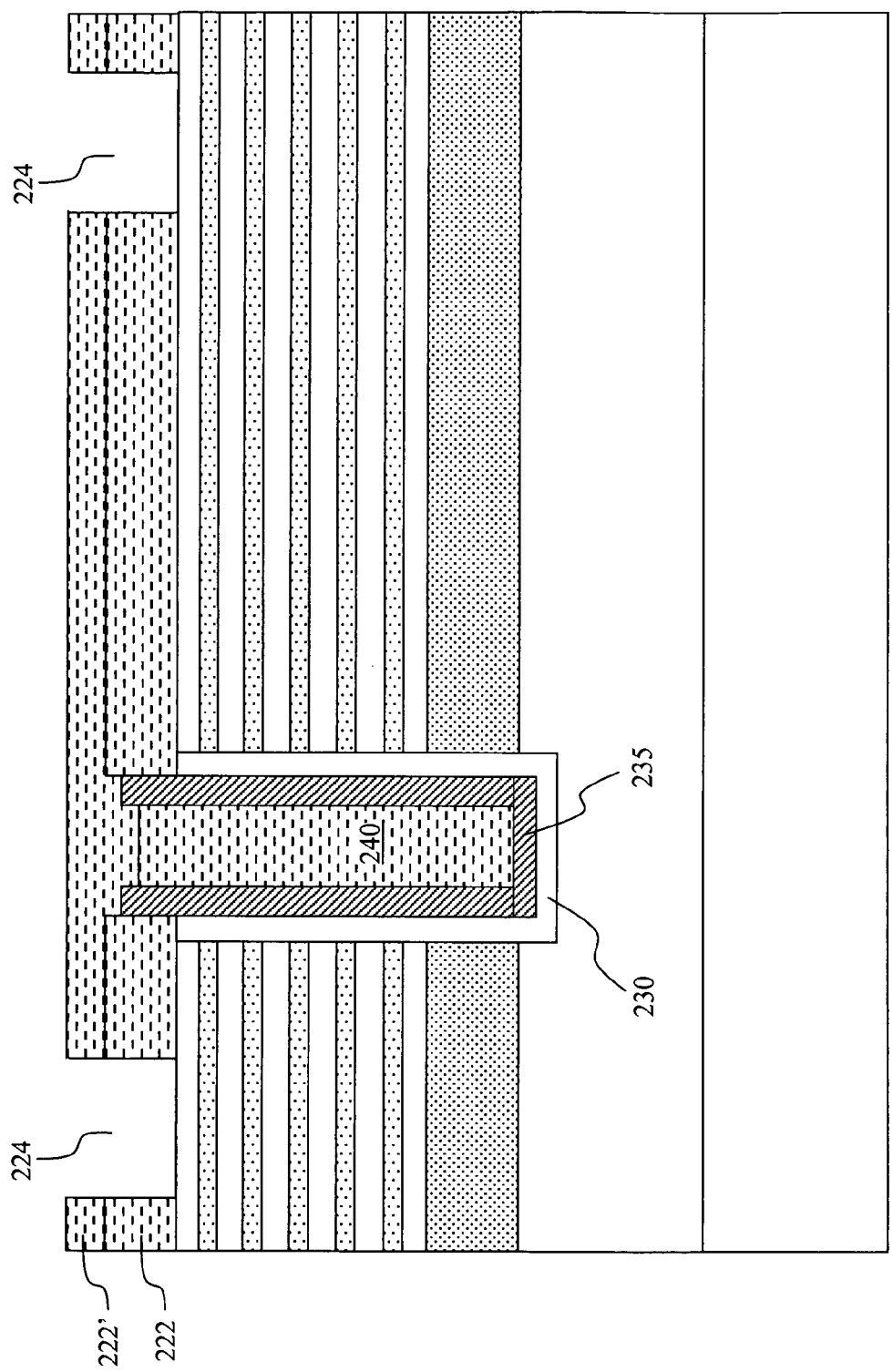
Figure 13H:
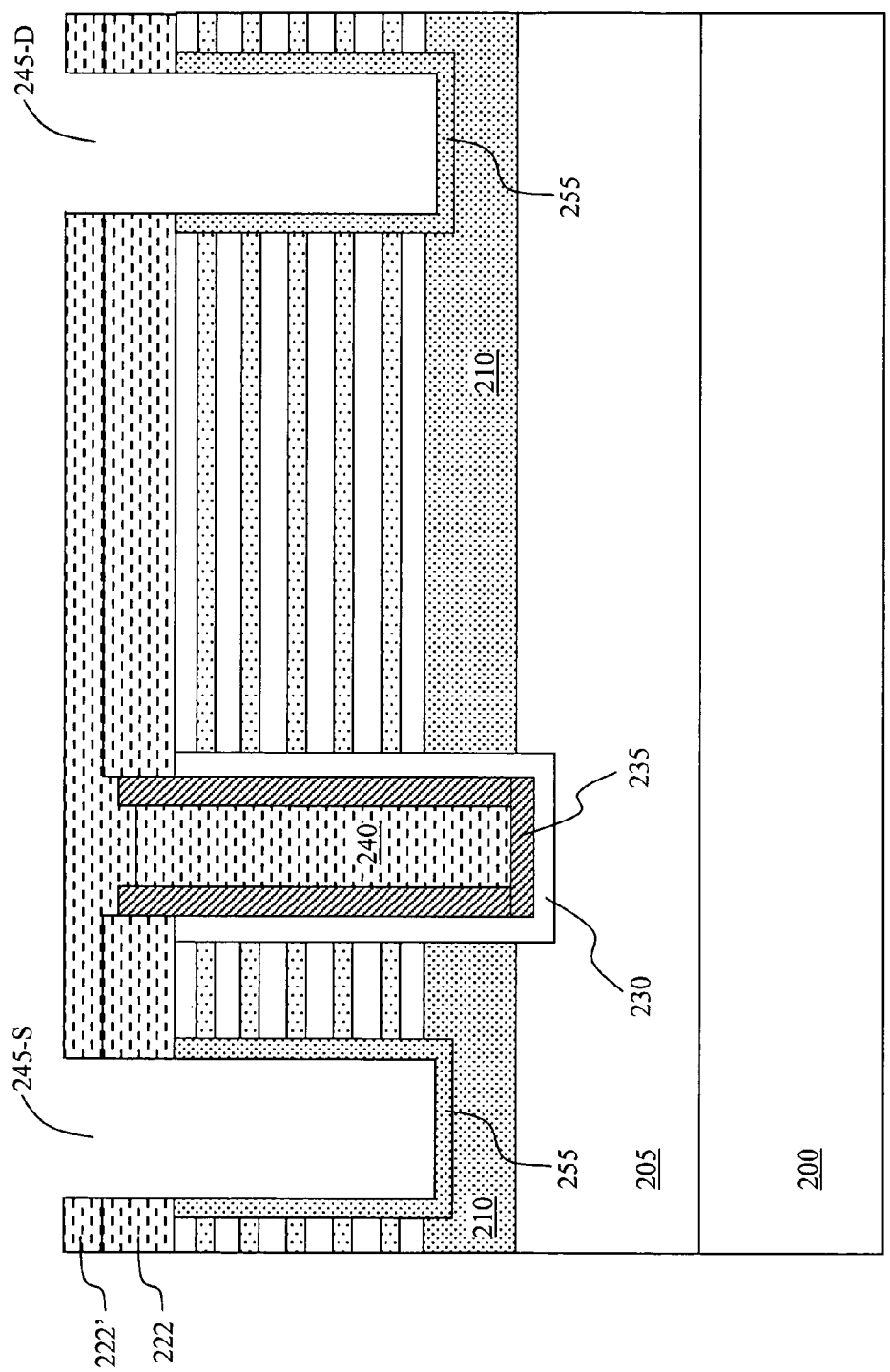
Figure 13I:
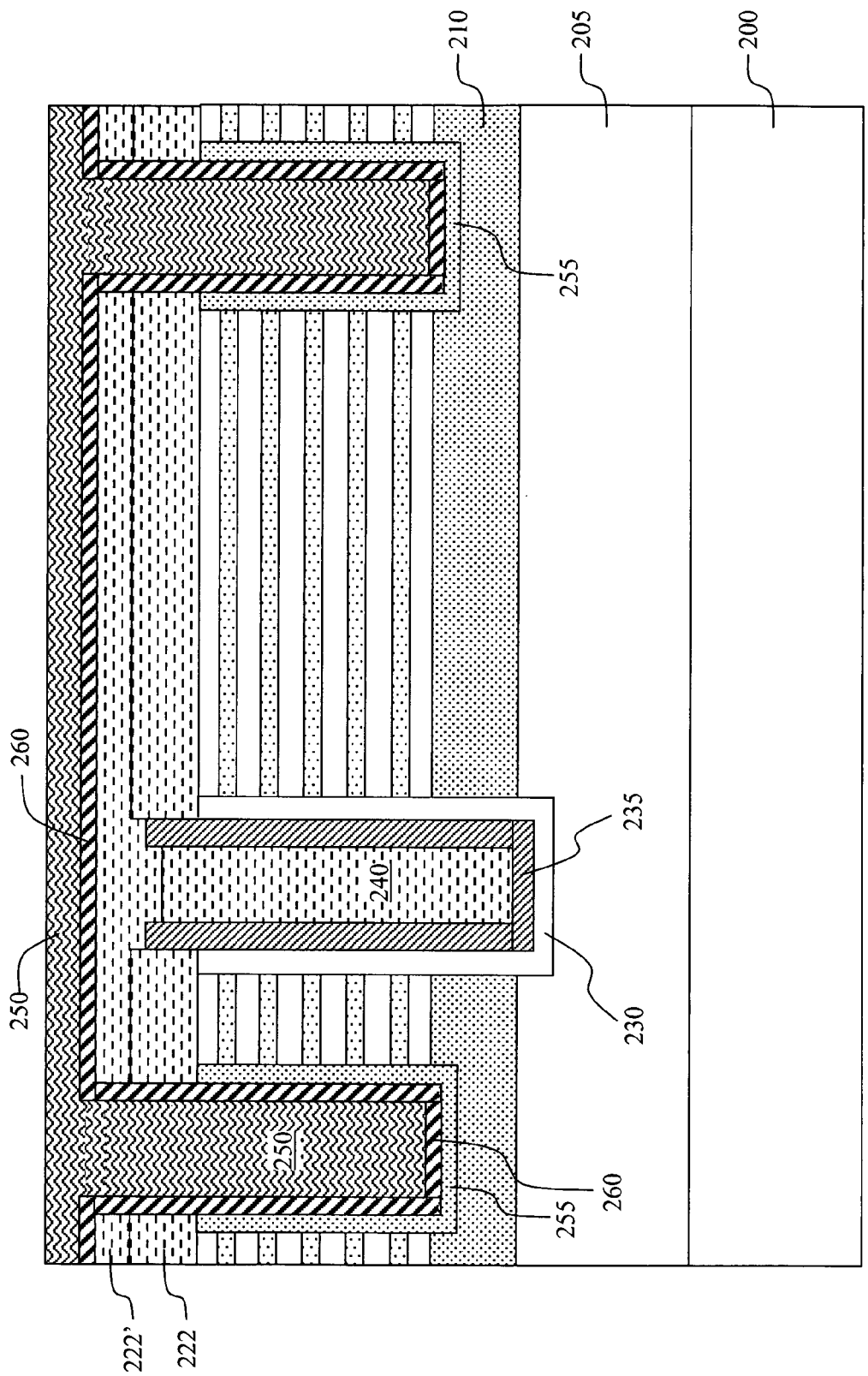
Figure 13J:
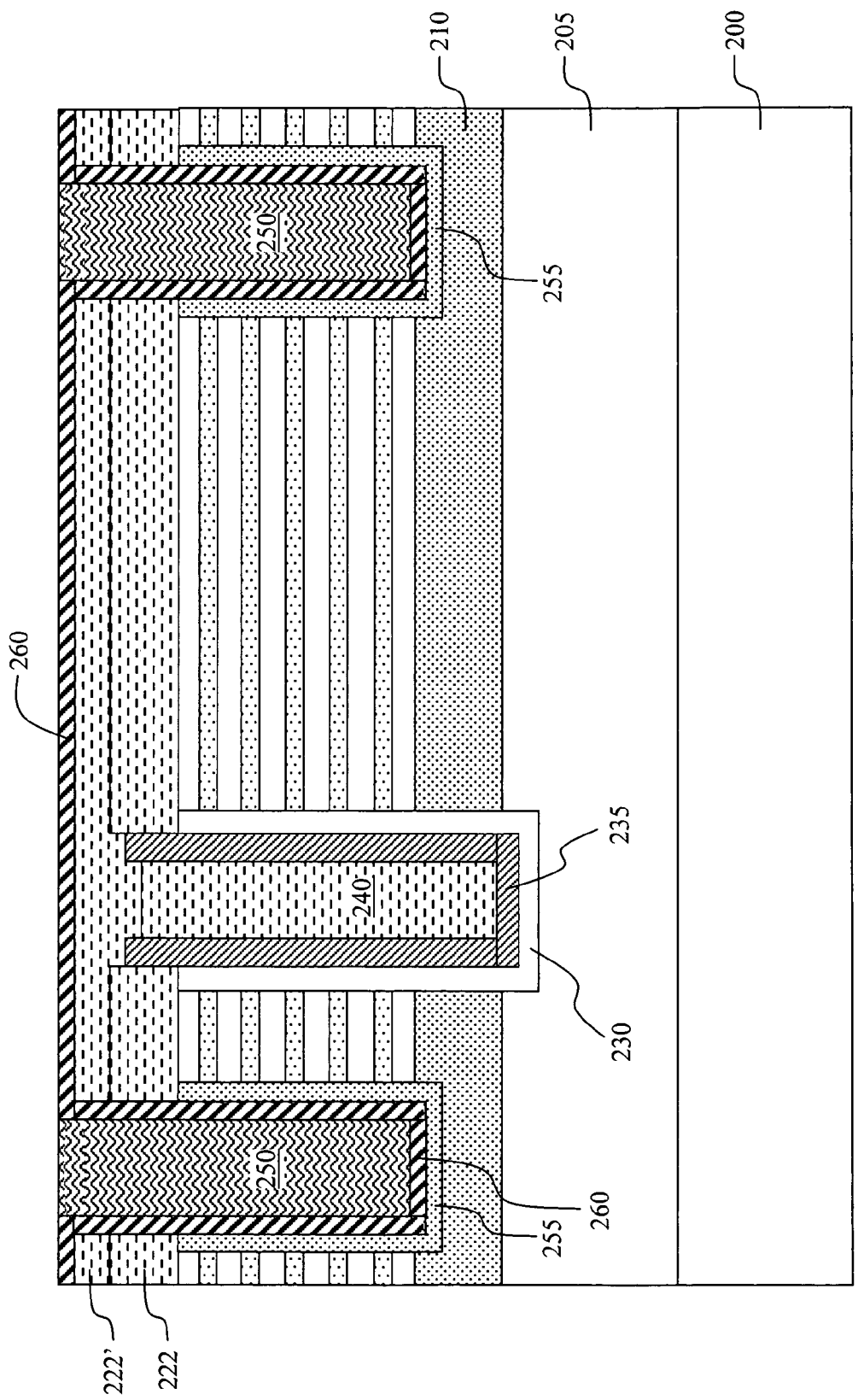
Figure 13K:
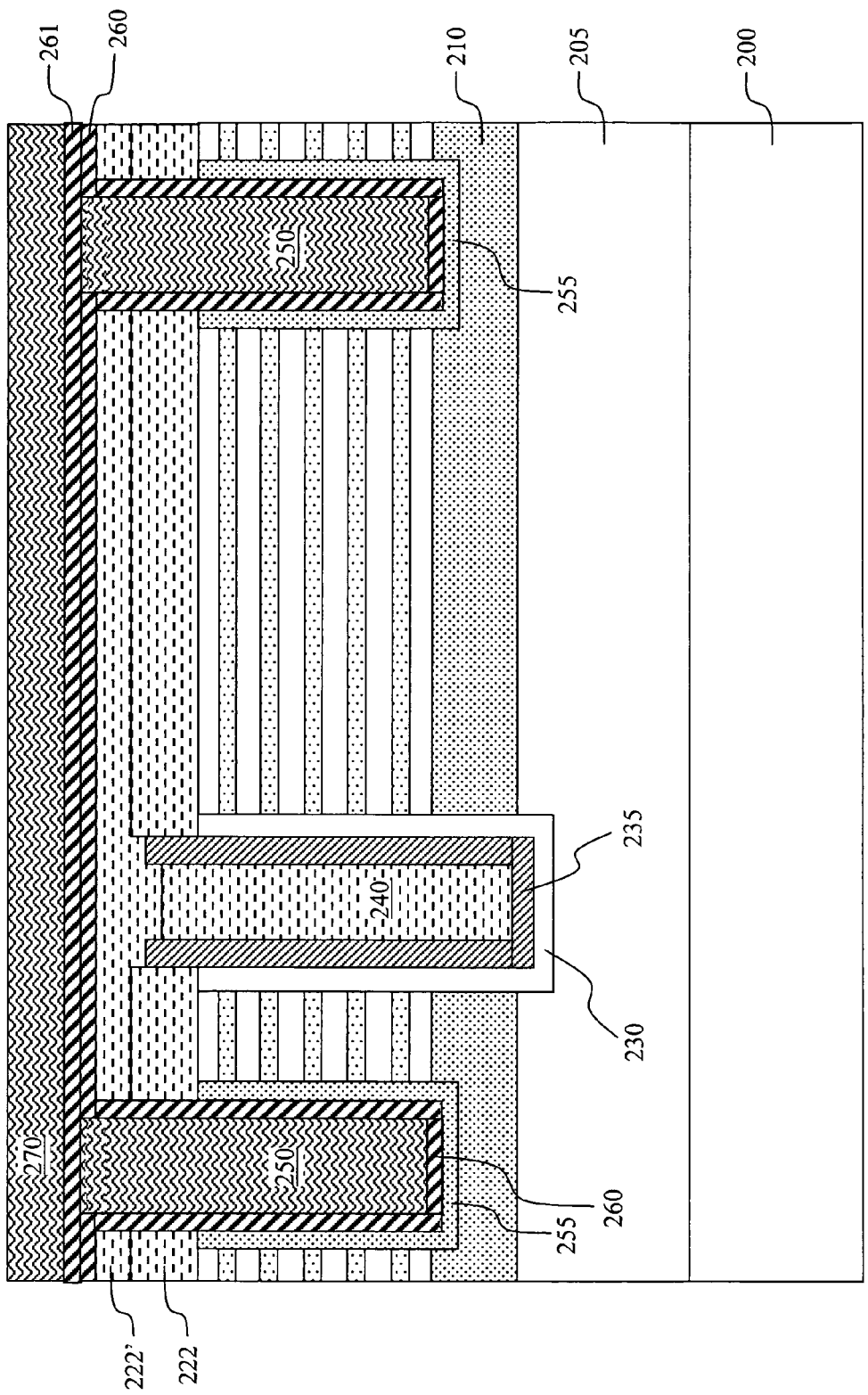
Figure 13L:
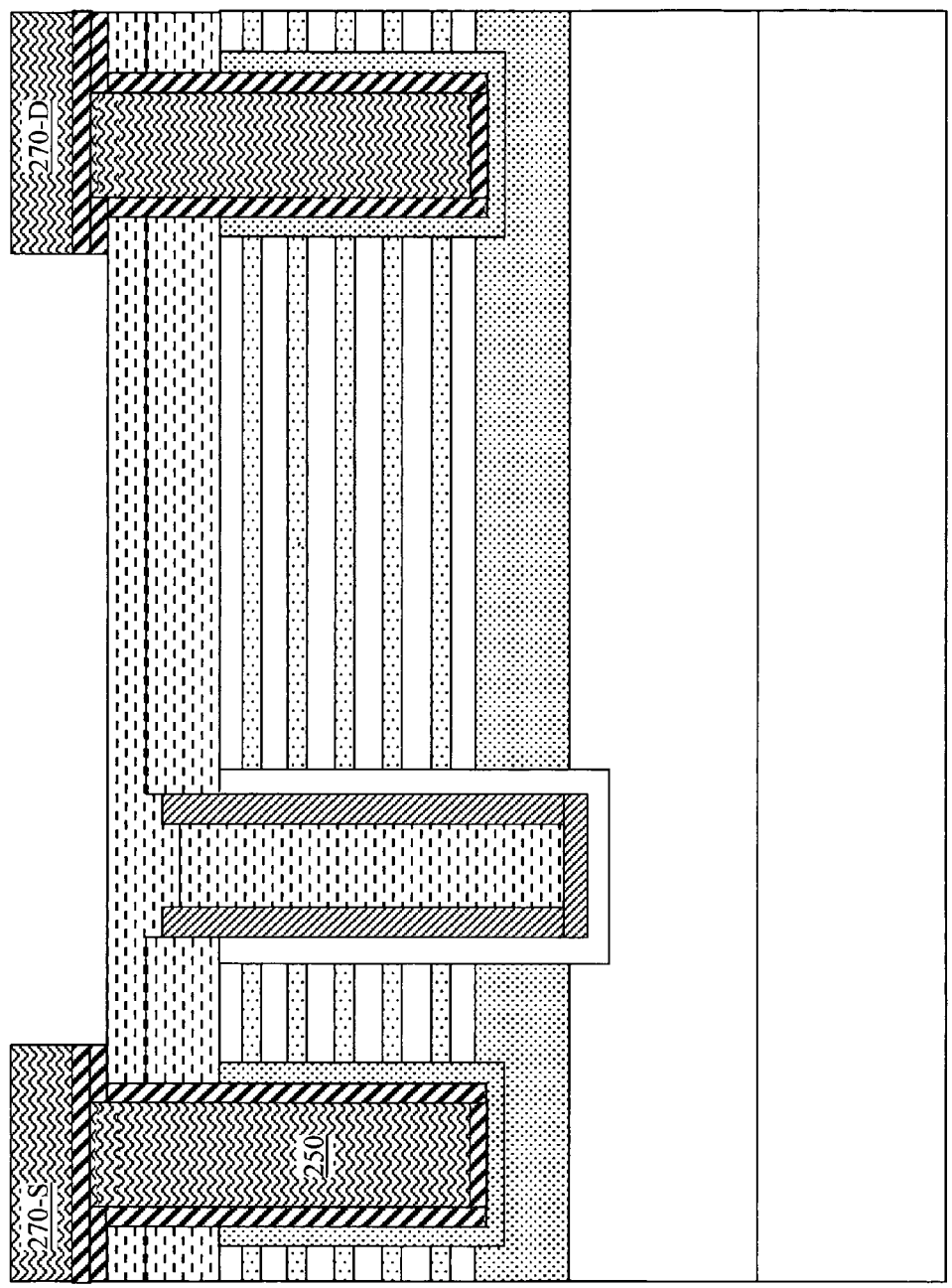
Figure 13M:
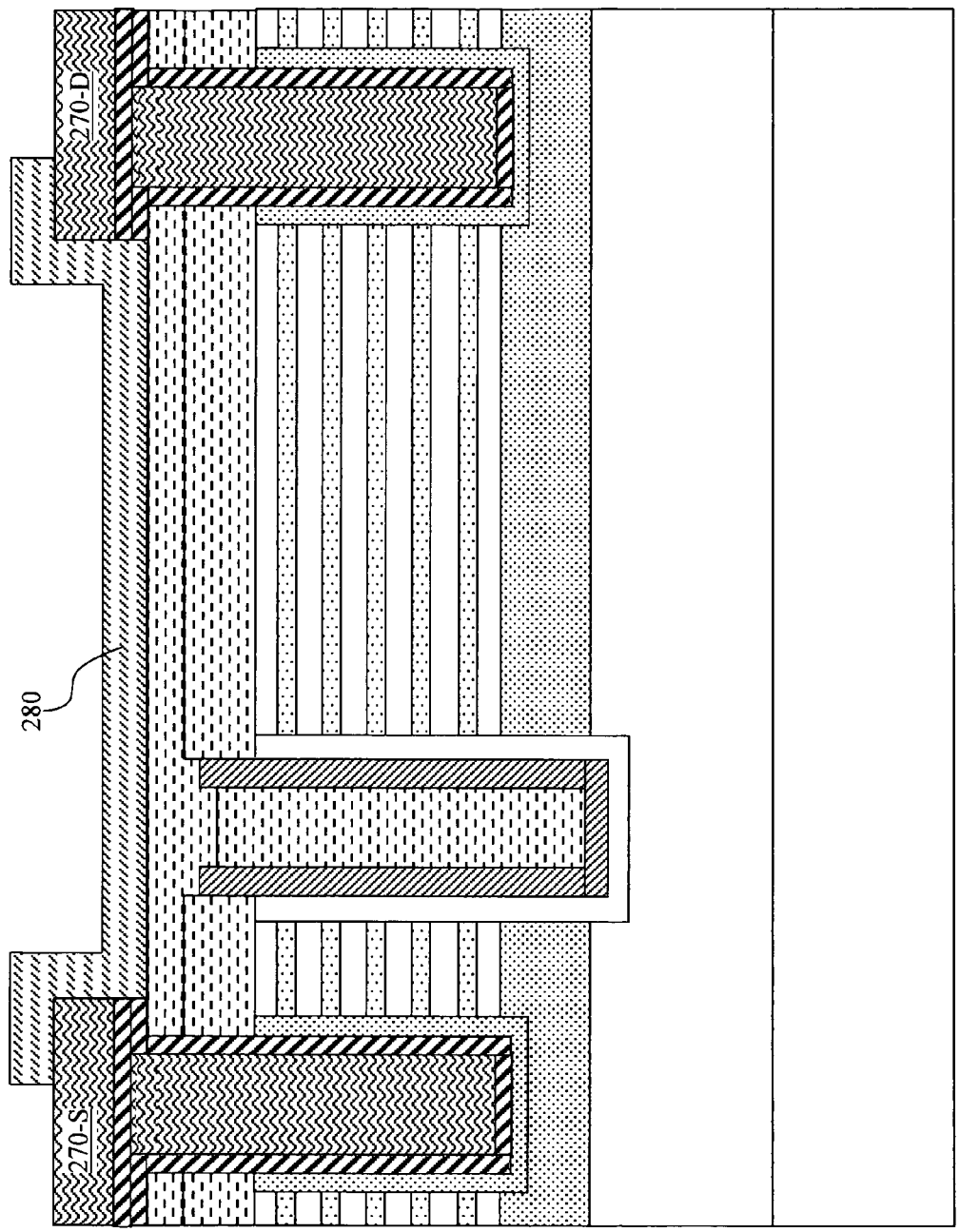
Figure 13N:
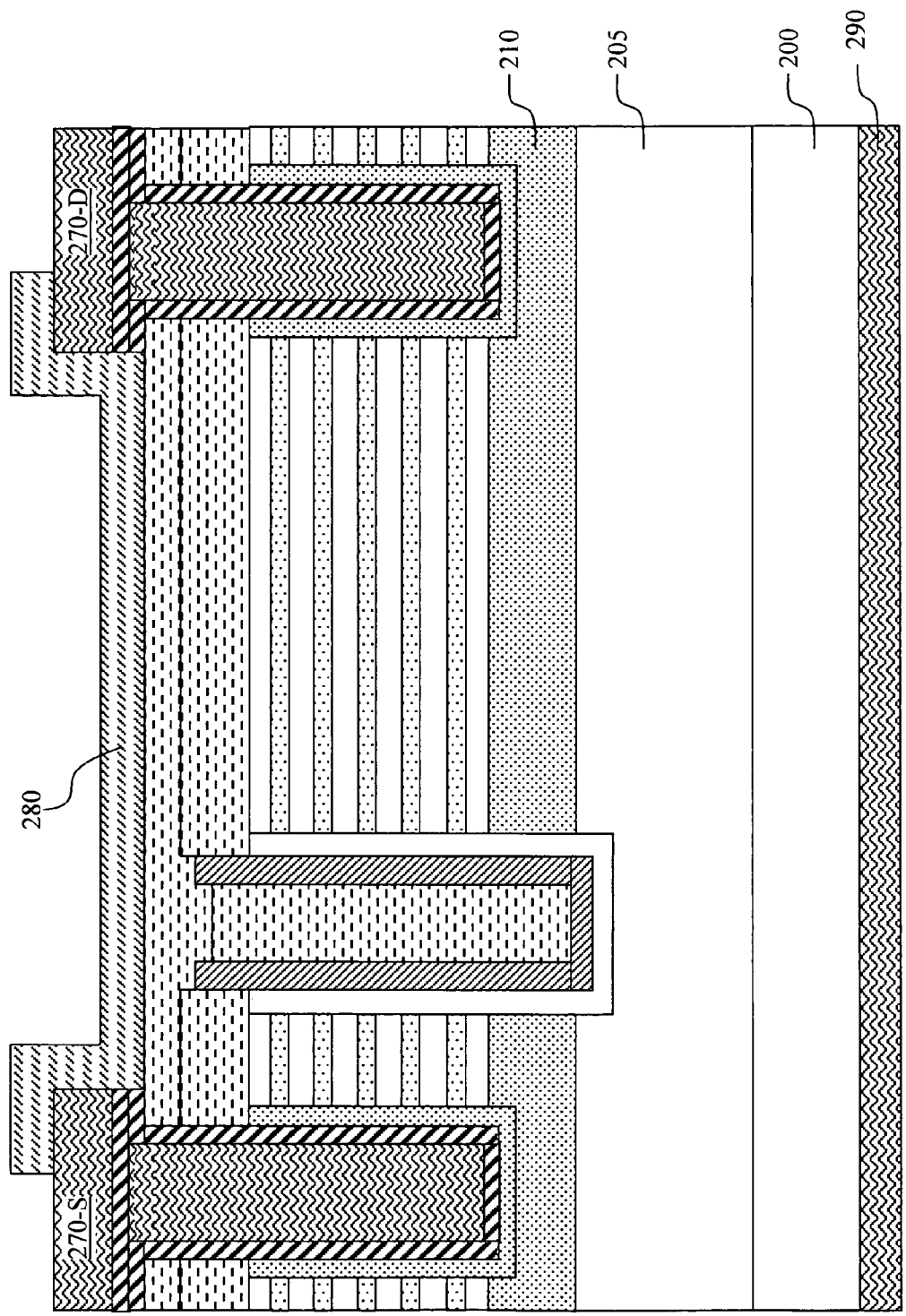

FIGS. 13A to 13N are a series of cross sectional views for illustrating the processing steps for manufacturing a JFET device with lateral super-junction structure of this invention. FIG. 13A shows a P+ substrate 200 supporting a P− epitaxial layer 205 with a dopant concentration and layer thickness designed to block a voltage of 600 volts. An N buffer layer 210 is formed on top of the P− epitaxial layer and alternate P and N dopant layers 215 and 220 respectively as charge balanced layers are formed on top of the N buffer layer 210 using one of the processes shown in FIGS. 10 to 12 described above. The N buffer layer 210 may also be formed either by epitaxial growth or dopant implantation and diffusion into the top of P− epitaxial layer 205. In FIG. 13B, a hard mask layer 222 is formed, e.g., through a thermal oxide process to grow an oxide layer with a layer thickness of approximately 200 Angstroms followed by oxide deposition to form thick oxide layer to function as a hard mask layer 222. A photoresist mask is used to etch through the hard mask 222 and form opening 223. In FIG. 13C, a trench etch process is carried out to open the gate trenches 225 extending vertically through the buffer layer 210 to reach the P-epitaxial layer 205 having a depth approximately 60 micrometers and a width about 10 micrometers. The gate trench 225 may be formed with a slight taper of 88 degrees to improve the manufacturability of the device. In FIG. 13D, a P+ implant with boron ions of implant energy of 40 Key, concentration of 5 E15 $cm^{-2}$, and a tilt angle of about seven degrees and four 90-degree rotations followed by a perpendicular boron ion implant of the same ion flux into the gate trench to form the P+ region 230 surrounding the gate trenches 225. In FIG. 13E, a polysilicon lining layer 235 is first formed on the sidewalls and bottom surface of the gate trenches 225 then an oxide layer 240 is filled into the gate trenches. The polysilicon layer may also be doped p+ to reduce the resistance of the gate trench. Then a polysilicon and oxide etch back is carried out to remove the polysilicon and oxide above the top surface of the gate trenches 225. The polysilicon layer 235 is optional, but can act as an endpoint when etching or chemical mechanical polishing (CMP) back the oxide layer 240. The polysilicon 235 may be deposited undoped—later P type dopants from the P+ layer 230 will diffuse into the polysilicon 235.

In FIG. 13F a second oxide layer 222' is deposited on top of the first oxide layer 222. In FIG. 13G, a source/drain mask is applied to open trench openings 224 through the oxide layers 222 and 222'. In FIG. 13H, source and drain trenches 245-S and 245-D are etched through the super-junction structure to a depth reaching the N buffer layer 210. In an embodiment the depth of the trenches is approximately between 40 to 44 micrometers and having a width of about ten micrometers. At any rate, the source and drain trenches 245-S and 245-D should end in the N buffer layer 210. Then the fabrication processes proceed with a tilt angular N+ implant of about 7 degrees to form N+ regions 255 surrounding the sidewalls followed by a perpendicular N+ implant. An N+ region 255 is formed surrounding the sidewalls and underneath the bottom surface of the source and drain trenches 245-S and 245-D. In FIG. 13I, a Ti/TiN layer 260 is first deposited covering the sidewalls, the bottom surface of the trenches and over the top surface of the substrate. Then, a thick metal layer 250 of 6-8 micrometers is deposited to fill the trenches 245-S and 245-D. In FIG. 13J, a chemical mechanical planarization (CMP) process is carried out to remove the top portion of the metal layer 250 to form a planar top surface. In FIG. 13K, a second metal layer 270 is deposited on the top surface covering over the Ti/TiN layer 260. Another Ti/TiN layer 261 may optionally be deposited before the metal layer 270 is deposited. In FIG. 13L, a metal mask is applied to pattern the metal layer 270 into a source metal 270-S and a drain metal 270-D. In FIG. 13M, a passivation layer 280 formed e.g., with a layer comprising a standard SiO2/nitride/polyimide stack followed by applying a passivation mask to pattern the passivation layer 280 to expose the source metal 270-S and the drain metal 270-D. In FIG. 13N, a back grinding operation is performed followed by a back metal process to form a bottom gate layer 290 on the bottom surface of the P+ substrate 200 to complete the manufacturing processes.

Figure 14B:
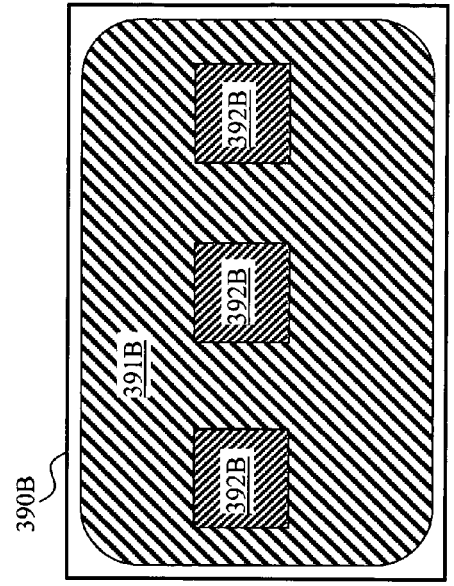
FIGS. 14A to 14C are top views illustrating methods of integrating a high voltage super junction lateral power device of this invention with a low voltage MOSFET on a single semiconductor die to form a normally on device.
Figure 14A:
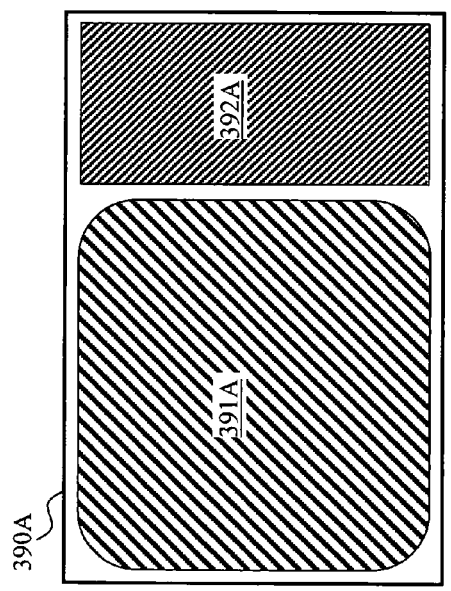
Figure 14C:
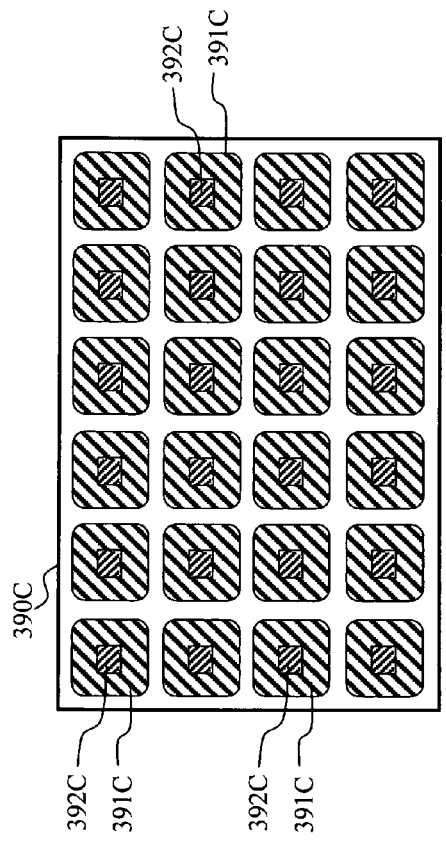

FIGS. 14A-14C are top views showing three possible ways of integrating a low voltage MOSFET with a high voltage lateral super junction JFET of this invention together on a single semiconductor die. The MOSFET can be arranged with the JFET in a cascode circuit configuration in order to make the device a normally off power switch device. In FIG. 14A, the semiconductor die 390A contains a high voltage lateral super junction JFET 391A of this invention and a low voltage MOSFET region 392A. The JFET 391A and the MOSFET 392A each occupy a separate portion in the semiconductor die 390A. In FIG. 14B, three MOSFET regions 392B are distributed throughout a single large JFET region 391A to reduce package resistance and inductance in a die 390B. In FIG. 14C, a MOSFET 392C is integrated into each cell of JFET 391C in a die 390C. The MOSFETs and JFETs may be connected internally and/or externally in the cascode configuration. The low voltage MOSFET is very well known in the art and can come in any number of forms including lateral MOSFET, vertical MOSFET, trench gate, planar gate, etc, and there can be a number of different packaging schemes for connecting the MOSFET to the JFET in a cascode circuit configuration if they are not already connected so within the semiconductor die.

Figure 15:
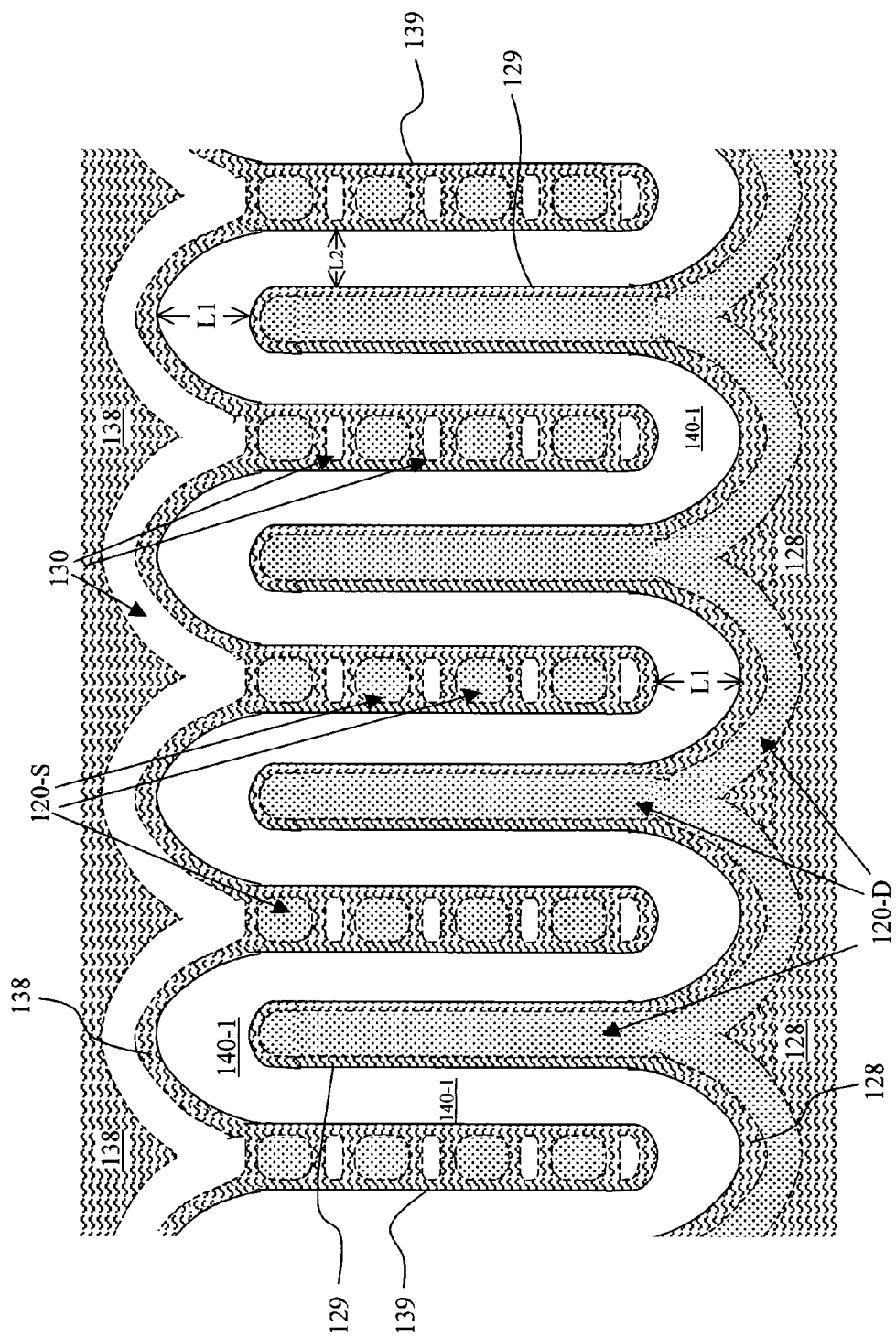
Figures 1, 15:
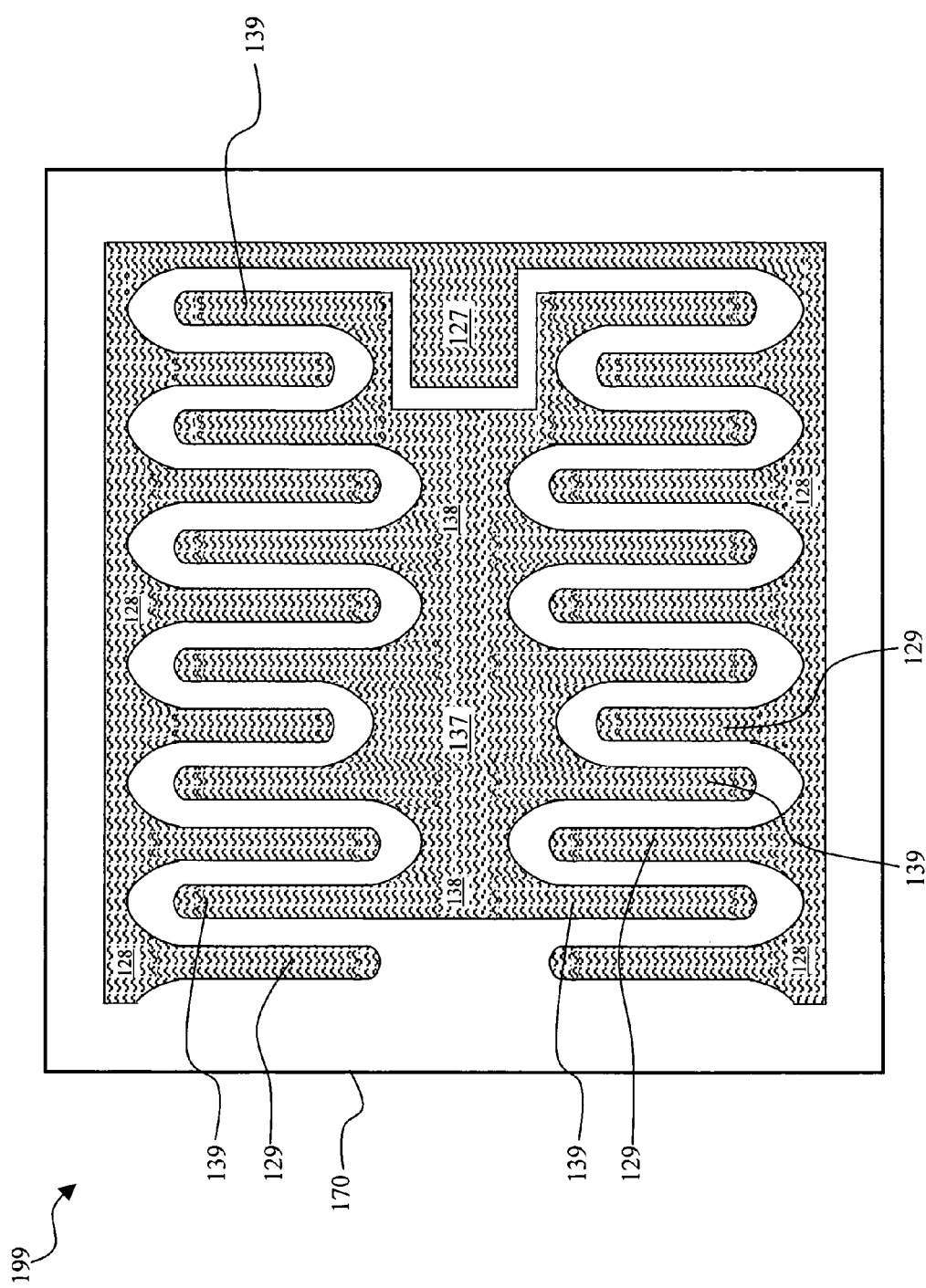
Figures 2, 15:
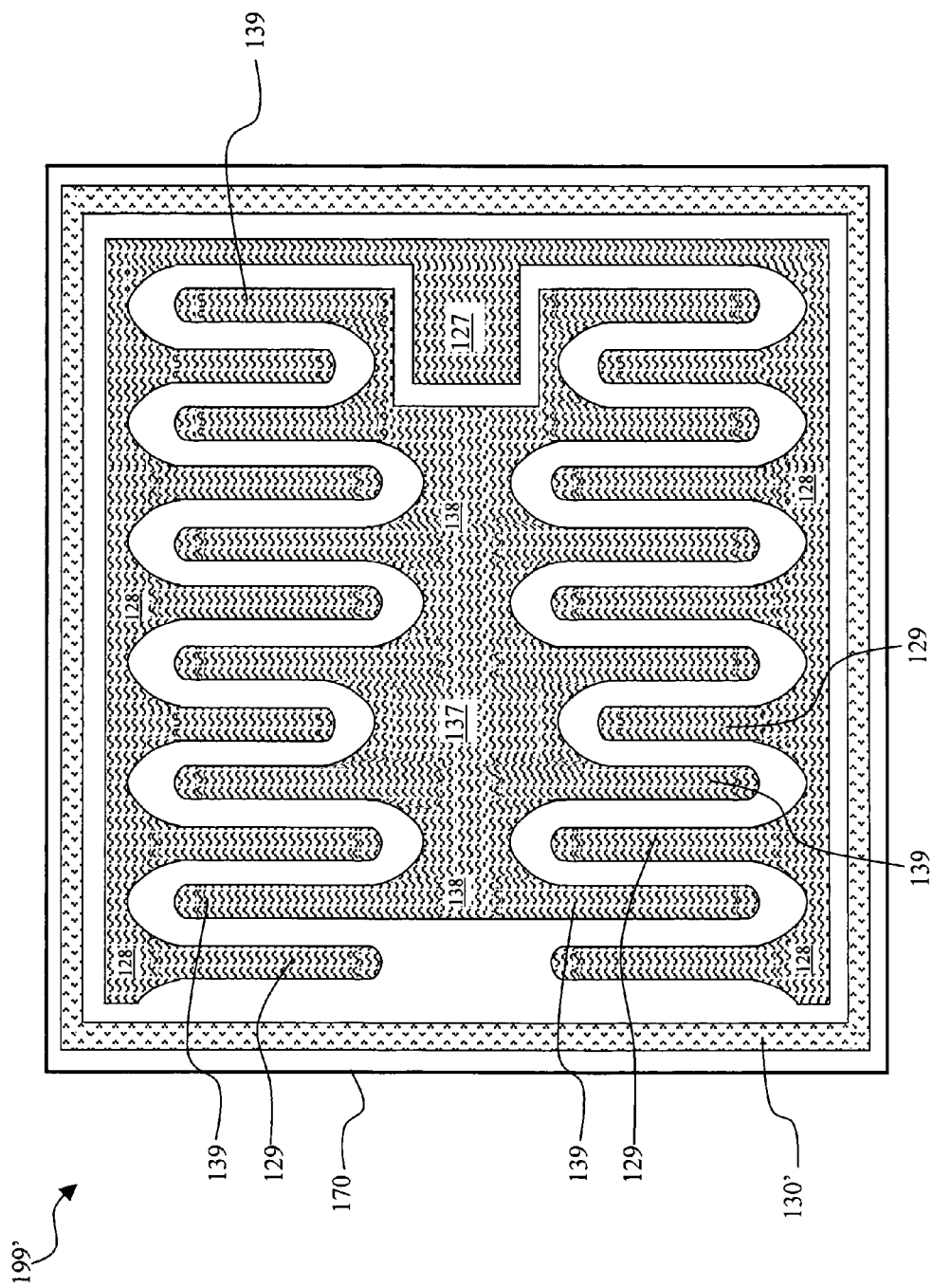
Figures 3, 15:
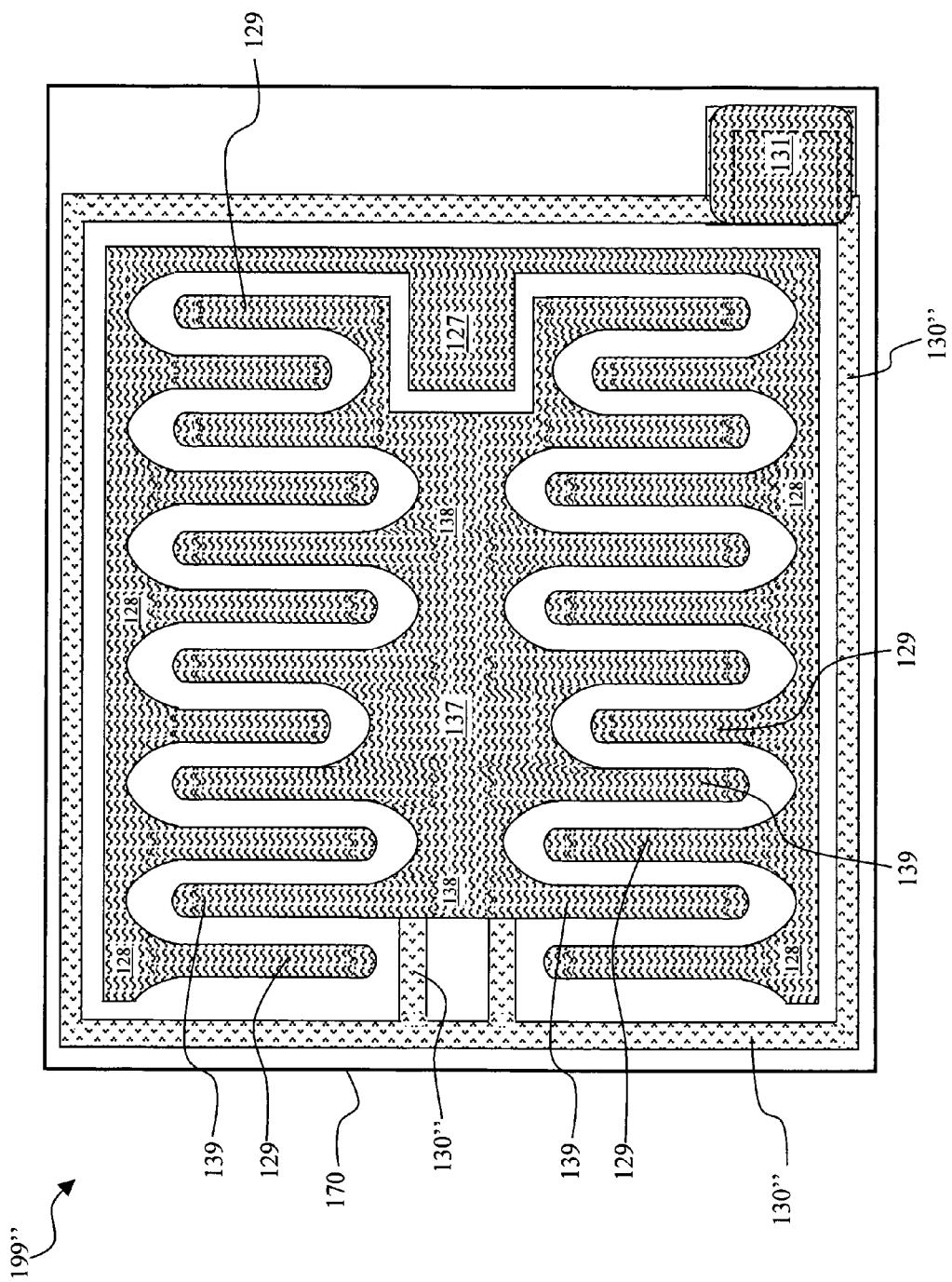

FIG. 15 is a top view showing the layout of the gate/source and drain fingers in a large area device. Using the labels from FIGS. 2-4, the setup in FIG. 15 shows a number of interdigitated fingers. One set of fingers, the source/gate fingers 139, is covered with the source metal 139. The second set of fingers—the drain fingers 129—is covered with the drain metal 128. The source/gate fingers 139 and drain fingers 129 are interdigitated. In the source fingers 139, under the source metal 138, are located the N+ source columns 120-S and P+ gate columns 130. The N+ source columns 120-S contact the source metal 138, but the P+ gate columns 130 are insulated from the source metal 138, e.g., by an oxide layer. The source and gate columns 120-S and 130 are arranged in a staggered formation along the source/gate fingers 139. In the drain fingers 129, beneath the drain metal 128, are located the N+ drain columns 120-D. Between the source and drain fingers are located the drift region of the lateral super junction structure, of which only the top P type layer 140-1 is visible. Oxides are not shown in this view for better clarity.

In one embodiment, the tip length L1 between the tips of the fingers and the adjacent metal layer are made greater in comparison to the side-by-side length L2 between a source/gate finger 139 and drain finger 129 in order to improve electric field spreading and provide even breakdown voltage throughout the device. For example L2 might be twice as large as L1.

In another embodiment, the P+ gate columns 130 are made with smaller area to allow for larger areas for N+ source columns 120-S. This reduces the drain to source resistance Rds by reducing the current spreading due to the P+ gate column 130 interruption of the N+ source column 120-S.

In another embodiment, the corners of the N+ source column 120-S, P+ gate column 130 and N+ drain column 120-D are rounded to prevent electric field crowding at sharp corners.

The layout of FIG. 15 may be applied to a semiconductor die 199 as illustrated in FIG. 15-1. The source/gate fingers 139 and the drain fingers 129 are arranged with the source metal 138 on the outside and the drain metal 128 on the inside. Alternatively, the source metal 138 could be on the inside and the drain metal 129 could be on the outside. The die edge 170 is shown on the sides of the die 199. Like the device 100''' of FIG. 6, the die 199' may also include a termination ring P+ column 130' that encircles the active area of the die 199', as shown in FIG. 15-2. The termination ring P+ column 130' is formed between the device active area (the area of the source/gate fingers 139 and drain fingers 129) and the die edge 170.

A space may be formed within the source metal 138 for a source pad 137, to which electrical connections, e.g., wire bonds, can be attached. Similarly a space may be formed on the drain metal 128 for a drain pad 127 for electrical connections.

FIG. 15-3 shows an alternative layout similar to FIG. 15 in which the die 199'' further comprises a gate pad 131 on its top surface. This may be useful in high speed switching applications where a minimal gate resistance Rg is needed. The gate trenches should then be interconnected using a polysilicon or second metal layer, laid out to lie most under the source metal regions, and extended to the gate pad 131.

Figure 16:
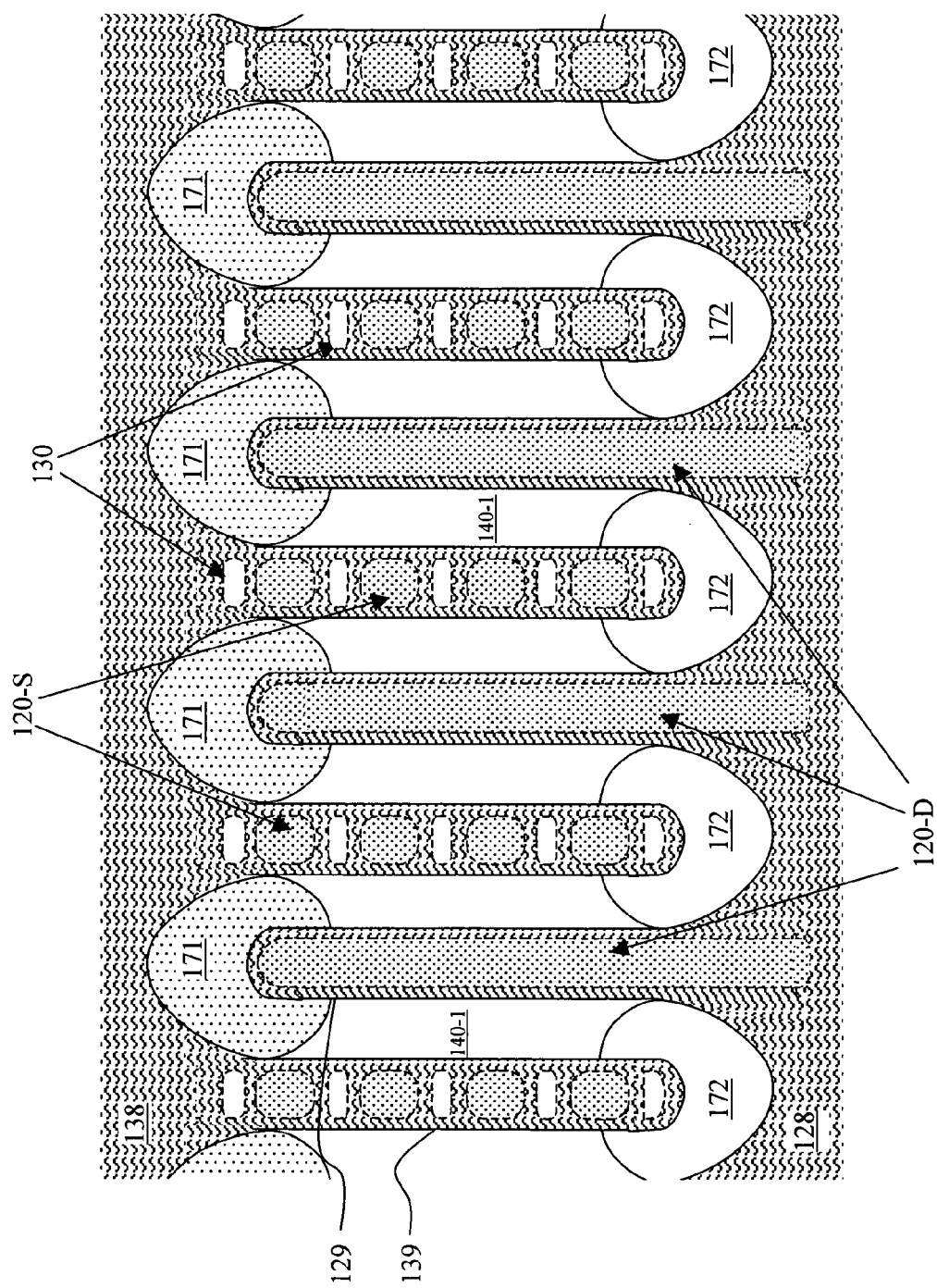
FIGS. 16 and 17 are top views showing methods of reducing electric field crowding at the tips of the fingers.

FIG. 16 illustrates another technique for reducing electric field crowding (thus improving breakdown voltage) at the tips of the fingers 129, 139. In this embodiment, the top of the lateral super junction structure is implanted to help spread out the electric field. In the vicinity of the tips of drain fingers 129, an N type implant is carried out on the surface to form N type tip regions 171. In the vicinity of the tips of the source/gate fingers 139, a P type implant is carried out on the surface to form P type tip regions 172. Alternatively, the same types of implants may be performed deeper within super junction structure, while still forming the P and N layers. The implantation type should be the same as that of the column at the tips of the fingers.

Figure 17:
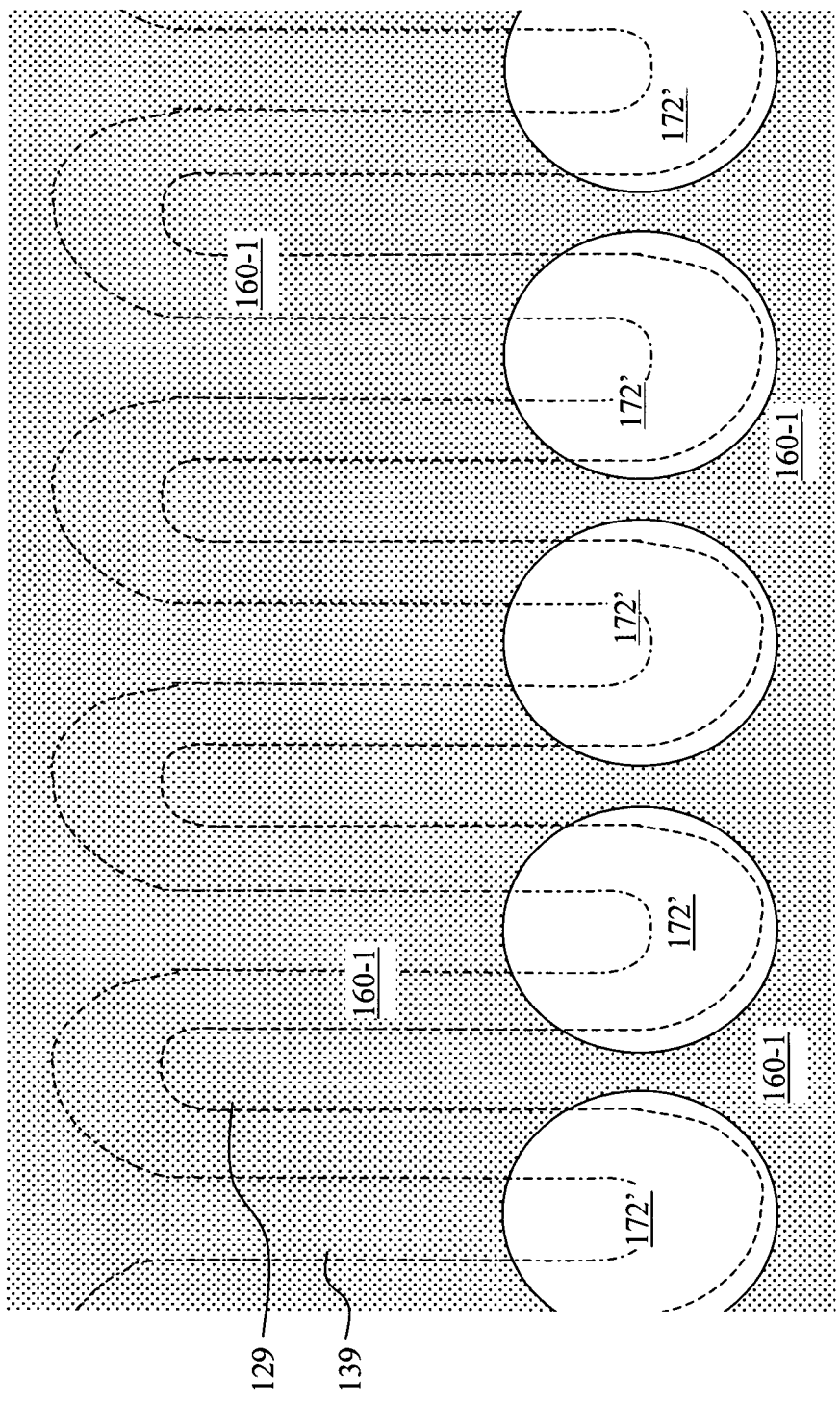

In yet another embodiment, a similar effect of reducing electric field crowding at the finger tips may be achieved by masking the N buffer layer 160' so that it is only formed in select regions as shown in FIG. 2-1. FIG. 17 shows a top view of the buffer layer. The outlines of drain fingers 129 and source/gate fingers 139 are indicated by the dashed lines. The N buffer layer 160-1 may be formed in all areas except around the tip of the source/gate fingers 139, effectively leaving a P type regions 172' of similar shape as P type tip regions 172 of FIG. 16, surrounded by N buffer layer 160-1.

Figure 18A:
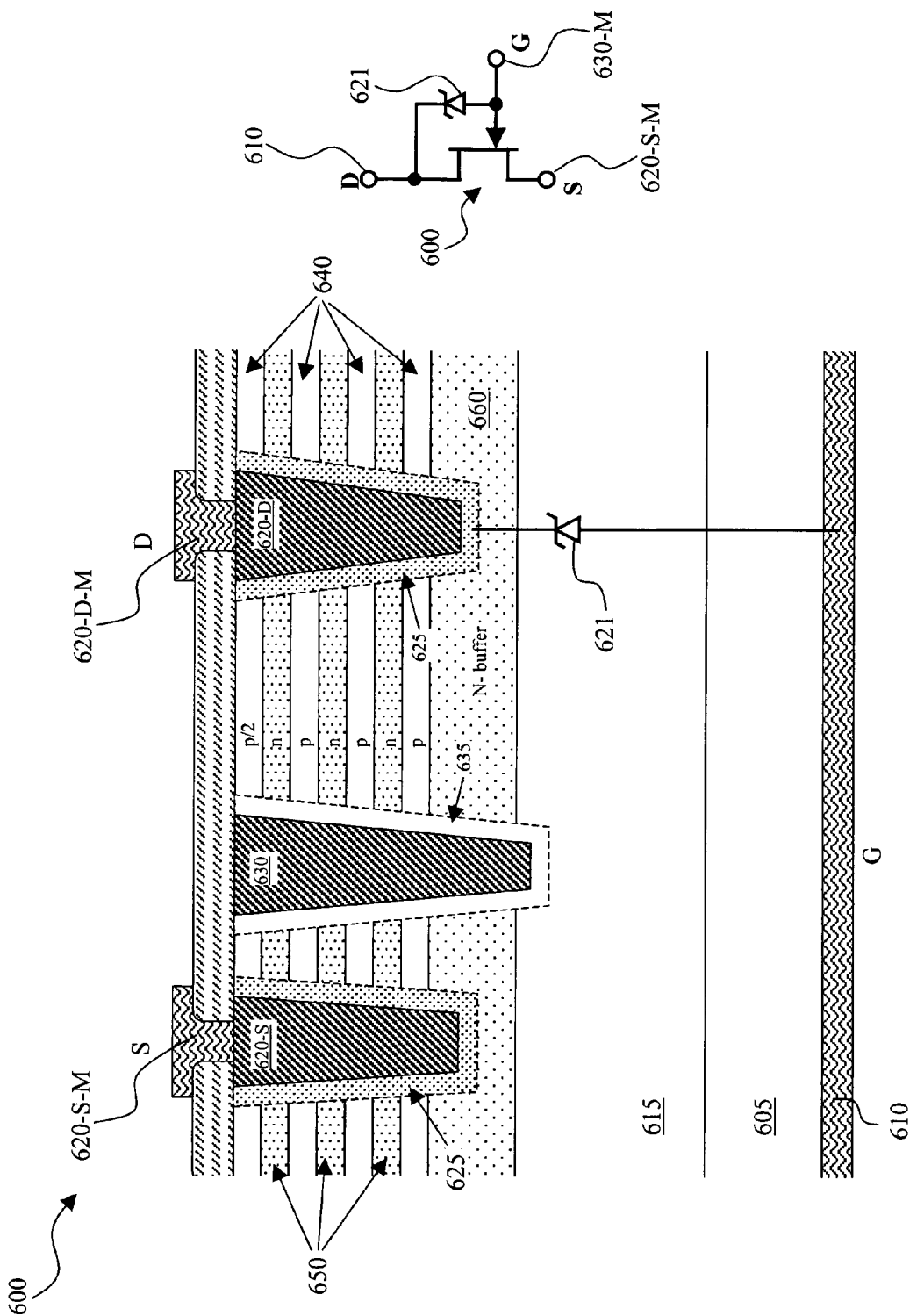
FIGS. 18A to 18C are cross sectional views showing alternate embodiments of this invention.

FIG. 18A shows a lateral super junction bottom gate JFET 600 of this invention with gate, source and drain columns similar to those shown in the bottom drain JFET 400 of FIG. 14. A lateral super junction structure is formed from charge balanced stacked alternating P and N layers 640 and 650 respectively. These layers are supported on a P-epitaxial layer 615 which is supported on a P+ gate substrate 605. A gate metal 610 may be formed under the P+ gate substrate 605. An N+ source column 620-S extends down through the lateral super junction structure. An N+ drain column 620-D similarly extends through the lateral super junction structure opposite the N+ source column 620-S. The N+ drain column 620-D and N+ source column 620-S both have an N lining layer 625. The rest of the N+ columns 620-S, 620-D may be filled with a conductive material such as metal or polysilicon. Drain metal 620-D-M and source metals 620-S-M may be formed on the top surface to contact the drain column 620-D and source column 620-S, respectively through the oxide 607. An N buffer layer 660 may be formed under the N+ drain column 620-D to reduce the curvature effects at the bottom of the drain column and to improve the breakdown voltage. An avalanche diode 621 may be formed from the P+ gate substrate 605 and P− epitaxial layer 615 to the N+ drain column 620-D (and N-buffer 660 and N+ lining 625). A P+ gate column 630 is also formed to control the JFET 600. The P+ gate column 630 extends downward to connect with the P epitaxial layer 615, and is lined with a P layer 635, which may be formed by implantation, deposition, diffusion, epitaxial growth or any other way as described previously.

Figure 18B:
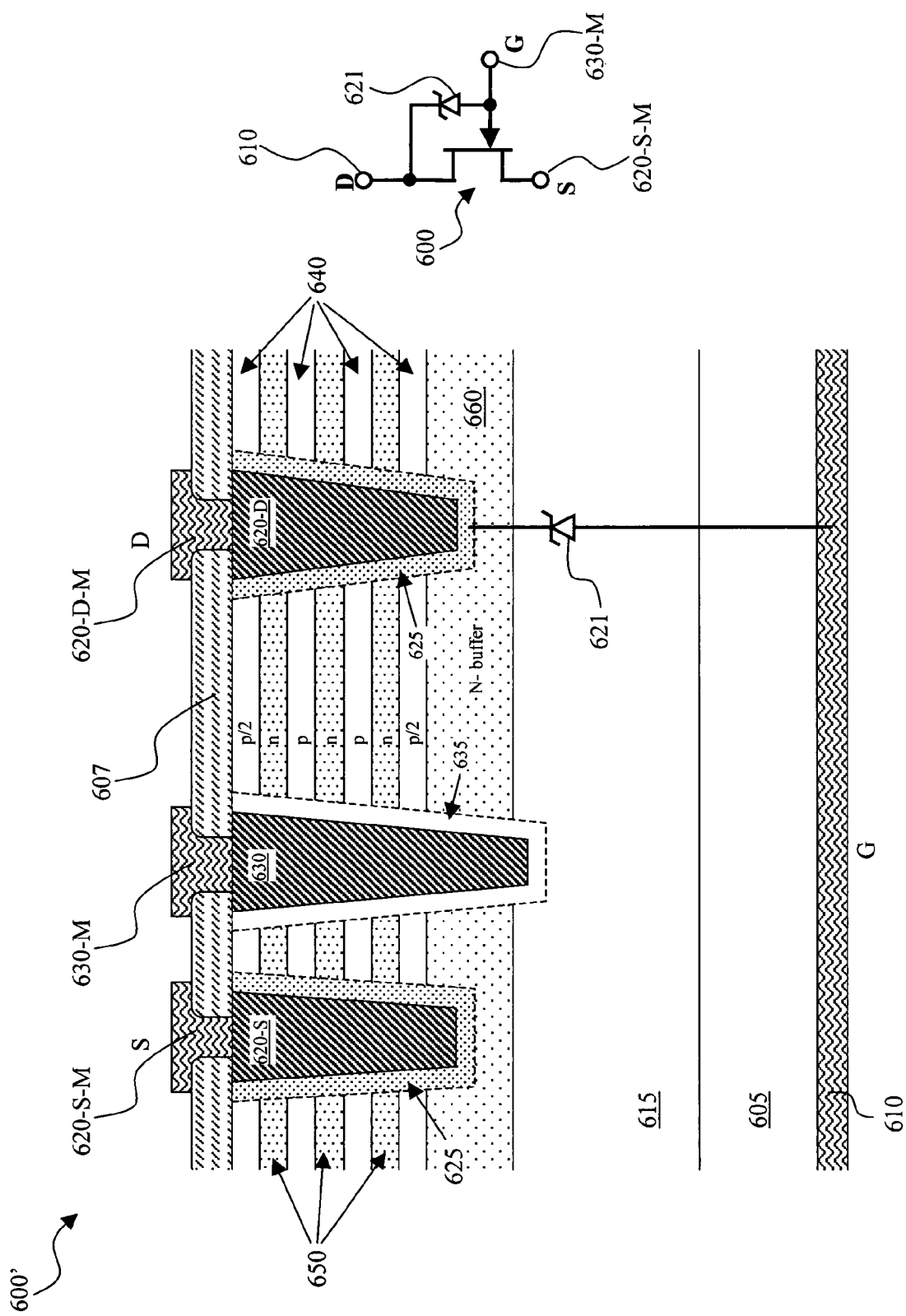
Figure 18C:
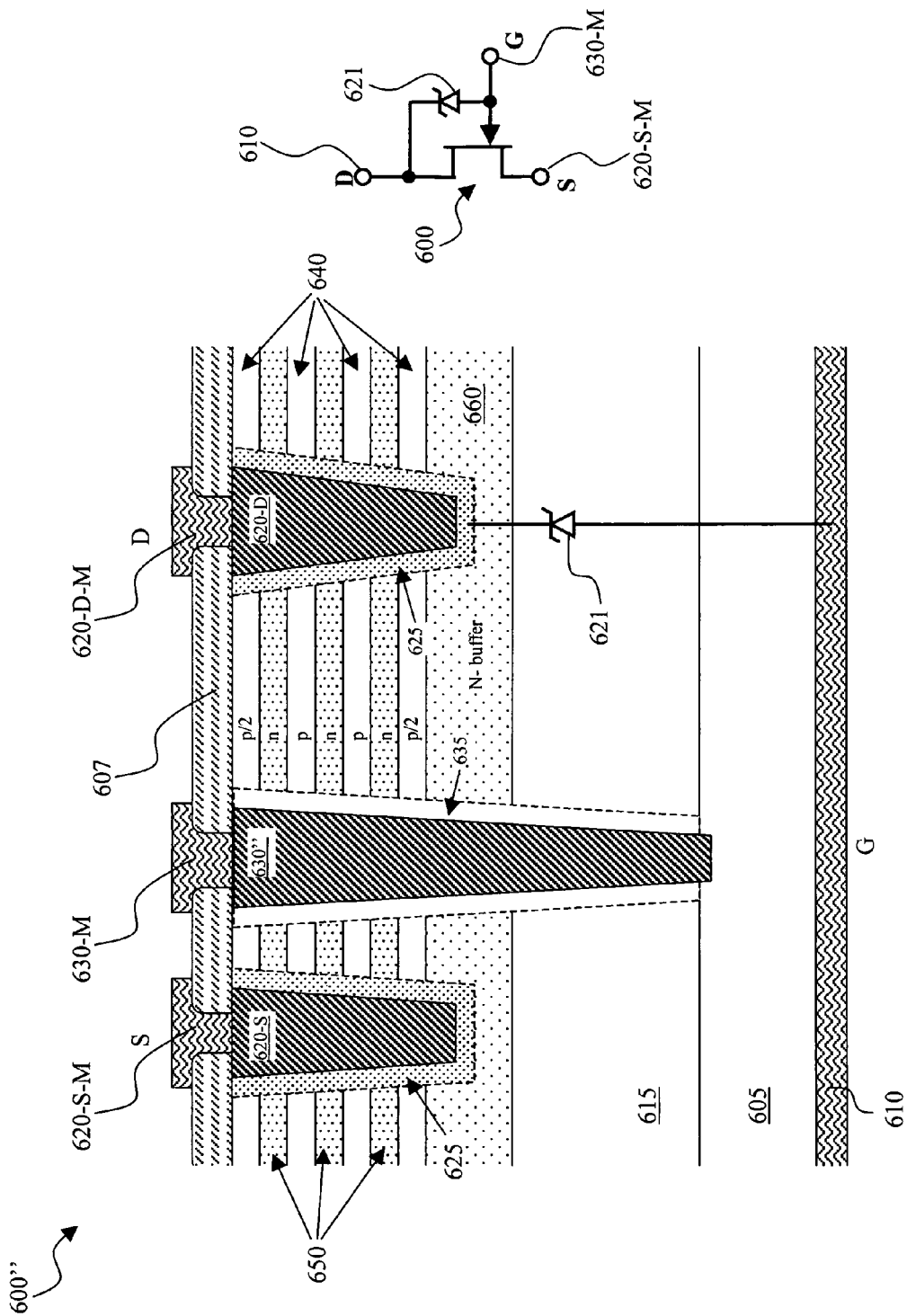

The P+ gate column 630 can also be connected to a gate metal 630-M on the top side, as shown in the JFET 600' of FIG. 18B. This can help reduce the gate resistance Rg. Another way to reduce the gate resistance Rg is to fill the P+ gate column 630 with metal. In another embodiment the P+ gate column 630'' extends down into P+ substrate, which can also reduce the gate resistance Rg, as shown in FIG. 18C.

Figure 19:
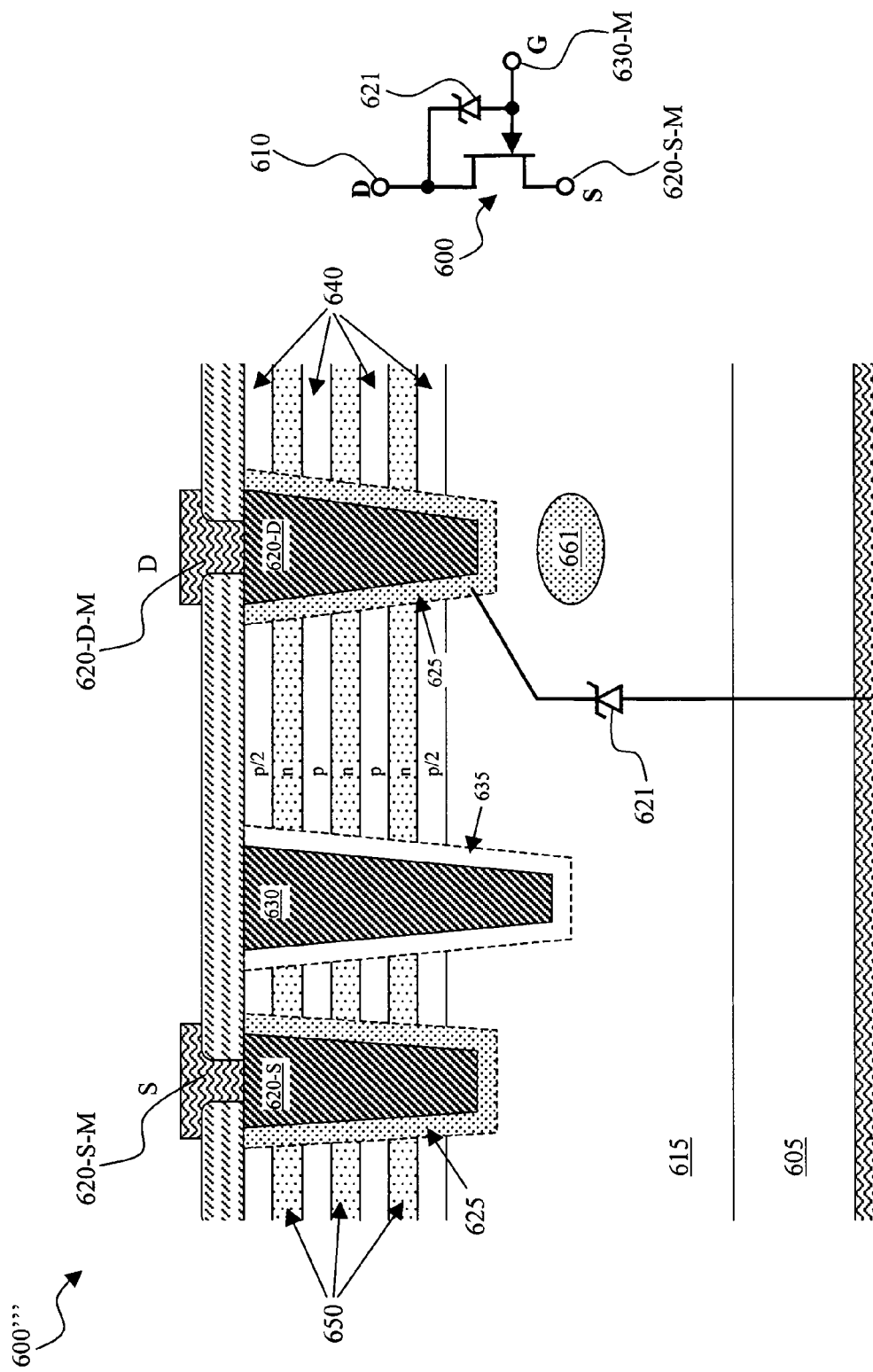
FIG. 19 is a cross sectional view showing an alternate embodiment of this invention.

Another technique for reducing electric field crowding under the N+ drain column 620-D is to form an N+ floating island 661 under the drain column which acts as a shield for the bottom of the N+ drain column 620-D as shown in the JFET 600' of FIG. 19.

While the above embodiments may have been described for silicon, it should be clear to one of ordinary skill in the art that they can be applied to any semiconductor material such as silicon carbide (SiC), germanium (Ge), diamond, or gallium arsenic (GaAs) or gallium nitride (GaN). Also, it should be clear that the N+ and P+ columns comprising the source, drain and gate columns may be formed in a number of different ways. Although the present invention shows an N-channel JFET, it may also be applied to a P-channel JFET, by switching the conductivity types of the P type and N type semiconductor regions.

Although the present invention has been described in terms of the presently preferred embodiment, it is to be understood that such disclosure is not to be interpreted as limiting. Various alterations and modifications will no doubt become apparent to those skilled in the art after reading the above disclosure. By way of example, although the above embodiments show a n-channel device, this invention is easily applicable to p-channel devices by switching the conductivity types of the semiconductor regions. Accordingly, it is intended that the appended claims be interpreted as covering all alterations and modifications as fall within the true spirit and scope of the invention.

We claim:

1. A semiconductor power device comprising:
a semiconductor substrate comprising a super-junction structure including a plurality of alternating P-doped and N-doped layers extending laterally from a source column to a drain column wherein said trench source column and drain column extend downward in said semiconductor substrate through two opposite sides of said super-junction structure disposed in said semiconductor substrate;
a gate column for applying a voltage thereon to control a current transmitted laterally through said super-junction structure between said source and said drain columns;
wherein the semiconductor substrate is a P substrate and wherein the drain column are N+ columns to form a Zener diode at a junction of said drain column with said P substrate to function as a built-in avalanche clamp diode; and
a buried doped region disposed in said semiconductor substrate below the drain column to increase an effective radius below the drain column for suppressing an electrical field crowding.

2. The semiconductor power device of claim 1 wherein:
the buried doped region is an N-buffer layer disposed below said drain column and extended laterally toward the gate column.

3. The semiconductor power device of claim 2 wherein:
the N-buffer layer disposed below the drain column and extended to and an area laterally between the drain column and the gate column.

4. The semiconductor power device of claim 1 wherein:
the buried doped region is an N-buffer region disposed below and surrounding bottom sidewalls and a bottom wall of the drain column.

5. The semiconductor power device of claim 1 further comprising:
a source graded N-Dopant diffusion region and a drain graded N-Dopant diffusion region surrounding sidewalls of said source and drain columns respectively.

6. The semiconductor power device of claim 1 wherein:
said gate further comprises a P+ column disposed in a gate column connected to said P doped layers of said super junction structure for applying a voltage to control a current transmitted through said super junction structure.

7. The semiconductor power device of claim 6 further comprising:
a graded P diffusion region having a graded P dopant profile diffused from said P+ column of said gate column.

8. The semiconductor power device of claim 1 wherein:
said gate further comprises a P+ column connected to said P doped layers of said super junction structure and connected to the P substrate.

9. The semiconductor power device of claim 1 wherein:
said gate further comprises a trench P+ column connected to said P doped layers of said super junction structure and disposed near said source column outside of an area between said source column and said drain column wherein said source column is segmented to have a gap area for said P+ gate column to apply a voltage to control a current transmitted through said super junction structure.

10. The semiconductor power device of claim 1 further comprising:
a conductive field plate disposed on a top surface of said drain N+ column.

11. The semiconductor power device of claim 1 further comprising:
an active area for disposing said super junction structure extends between said source and drain column; and
a termination area outside said active cell area comprises a P+ termination column extending down to the substrate, the P+ termination column being located between the active area and the semiconductor die edge.

12. The semiconductor power device of claim 6 wherein:
said P+ gate column extends into said P substrate at a greater depth in said semiconductor substrate than said source and drain columns.

13. The semiconductor power device of claim 6 further comprising:
a gate electrode comprising a gate metal layer disposed below a bottom surface of said semiconductor substrate.

14. The semiconductor power device of claim 6 further comprising:
wherein the source, drain and gate columns in the super junction structure form a JFET, the semiconductor power device further comprising
a MOSFET connected in a cascode circuit configuration with said JFET.

15. The semiconductor power device of claim 6 further comprising:
source/gate fingers having source and gate columns staggered along the length of the source/gate finger; and
drain fingers having a drain column running along the length of the drain finger; wherein
the source/gate are interdigitated with the drain fingers.

16. The semiconductor power device of claim 15 wherein:
the semiconductor surface in the vicinity to the tips of the source/gate and drain fingers are implanted the same conductivity type as the column located at the tips of the fingers.

17. A method for manufacturing a semiconductor power device on a semiconductor substrate comprising:
forming alternating P type and N type layers over a P substrate, the alternating P type and N type layers being charge balanced to function as a lateral super junction structure;
forming a P gate column through said lateral super junction structure reaching the P substrate; and
forming N source and N drain columns in through said lateral super junction structure; and
forming an avalanche clamping diode between the bottom of the N drain column and the P substrate, the avalanche clamping diode diverting avalanche current away from the super junction structure.

18. A method for manufacturing a semiconductor power device on a semiconductor substrate comprising:
forming alternating P type and N type layers over a P substrate, the alternating P type and N type layers being charge balanced to function as a lateral super junction structure;
forming a P gate column through said lateral super junction structure reaching the P substrate; and
forming N source and N drain columns in through said lateral super junction structure; and forming an N buffer layer under the N drain column to reduce the electric field crowding under the N drain column.

* * * * *